(12) United States Patent
Lai et al.

(10) Patent No.: US 11,853,137 B2
(45) Date of Patent: Dec. 26, 2023

(54) SYSTEM AND METHOD FOR POWER SUPPLY THERMAL MANAGEMENT BASED ON THERMAL ENVIRONMENT AND THERMAL STATES OF COMPONENTS OF POWER SUPPLIES

(71) Applicant: Dell Products L.P., Round Rock, TX (US)

(72) Inventors: Yu-Hung Lai, New Taipei (TW); Po-Yun Shih, Taipei (TW)

(73) Assignee: Dell Products L.P., Round Rock, TX (US)

( * ) Notice: Subject to any disclaimer, the term of this patent is extended or adjusted under 35 U.S.C. 154(b) by 59 days.

(21) Appl. No.: 17/575,311

(22) Filed: Jan. 13, 2022

(65) Prior Publication Data

US 2023/0221783 A1    Jul. 13, 2023

(51) Int. Cl.
G06F 1/26      (2006.01)
G06F 1/20      (2006.01)

(52) U.S. Cl.
CPC ............ G06F 1/206 (2013.01); G06F 1/26 (2013.01)

(58) Field of Classification Search
None
See application file for complete search history.

(56) References Cited

U.S. PATENT DOCUMENTS

| | | | | |
|---|---|---|---|---|
| 5,753,383 A | * | 5/1998 | Cargnelli | H01M 8/04007 429/442 |
| 11,520,392 B1 | * | 12/2022 | Breen | G06F 1/20 |
| 2003/0087139 A1 | * | 5/2003 | White | H01M 8/04365 429/436 |
| 2004/0183374 A1 | * | 9/2004 | Ponmalai | H02J 1/08 307/9.1 |
| 2007/0088963 A1 | * | 4/2007 | Nakaya | G03G 15/2039 713/300 |
| 2009/0014433 A1 | * | 1/2009 | O'Neil | G06F 1/26 219/491 |
| 2009/0204839 A1 | * | 8/2009 | Gross | G06F 1/206 713/340 |
| 2010/0070745 A1 | * | 3/2010 | Chiu | G06F 1/206 713/2 |
| 2010/0128644 A1 | * | 5/2010 | Shibuya | H04B 1/036 370/280 |
| 2012/0005469 A1 | * | 1/2012 | Jeng | G06F 1/206 702/130 |
| 2012/0080532 A1 | * | 4/2012 | Tai | G05D 23/1919 219/490 |
| 2013/0138935 A1 | * | 5/2013 | Belady | G06F 9/44 713/1 |

(Continued)

*Primary Examiner* — Danny Chan

(74) *Attorney, Agent, or Firm* — Womble Bond Dickinson (US) LLP

(57) ABSTRACT

Methods and systems for thermal management of components of a data processing system that may be used to provide computer implemented services are disclosed. The disclosed thermal management method and systems may improve the likelihood of data processing systems providing desired computer implemented services by improving the likelihood that desired power is provided by power supplies. To improve the likelihood of power supplies providing desired power, the power supplies may proactively take into account the thermal environment and/or thermal states of components of the power supply.

20 Claims, 16 Drawing Sheets

(56) References Cited

U.S. PATENT DOCUMENTS

| | | | |
|---|---|---|---|
| 2016/0334666 A1* | 11/2016 | Liu | G02F 1/133382 |
| 2020/0070500 A1* | 3/2020 | Koehler | B41J 2/0454 |
| 2020/0176999 A1* | 6/2020 | Rastegar | H01G 9/0003 |
| 2020/0379544 A1* | 12/2020 | Paul | G06F 1/28 |
| 2021/0103305 A1* | 4/2021 | Nikazm | G05D 23/1928 |
| 2021/0344213 A1* | 11/2021 | Yebka | H02J 7/007194 |
| 2023/0086310 A1* | 3/2023 | Utz | G06F 1/181 |
| | | | 700/202 |

* cited by examiner

US 11,853,137 B2

SYSTEM AND METHOD FOR POWER SUPPLY THERMAL MANAGEMENT BASED ON THERMAL ENVIRONMENT AND THERMAL STATES OF COMPONENTS OF POWER SUPPLIES

FIELD OF THE DISCLOSURE

Embodiments disclosed herein generally relate to thermal management. More particularly, embodiments disclosed herein relate to thermal management in mixed thermal operating range systems.

BACKGROUND

Computing devices may perform computations when providing computer implemented services. For example, computing devices may include any number of hardware devices that may perform computations. To provide the computer implemented services, the computing devices may consume electrical power to perform the computations. The consumed electrical power may generate heat.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
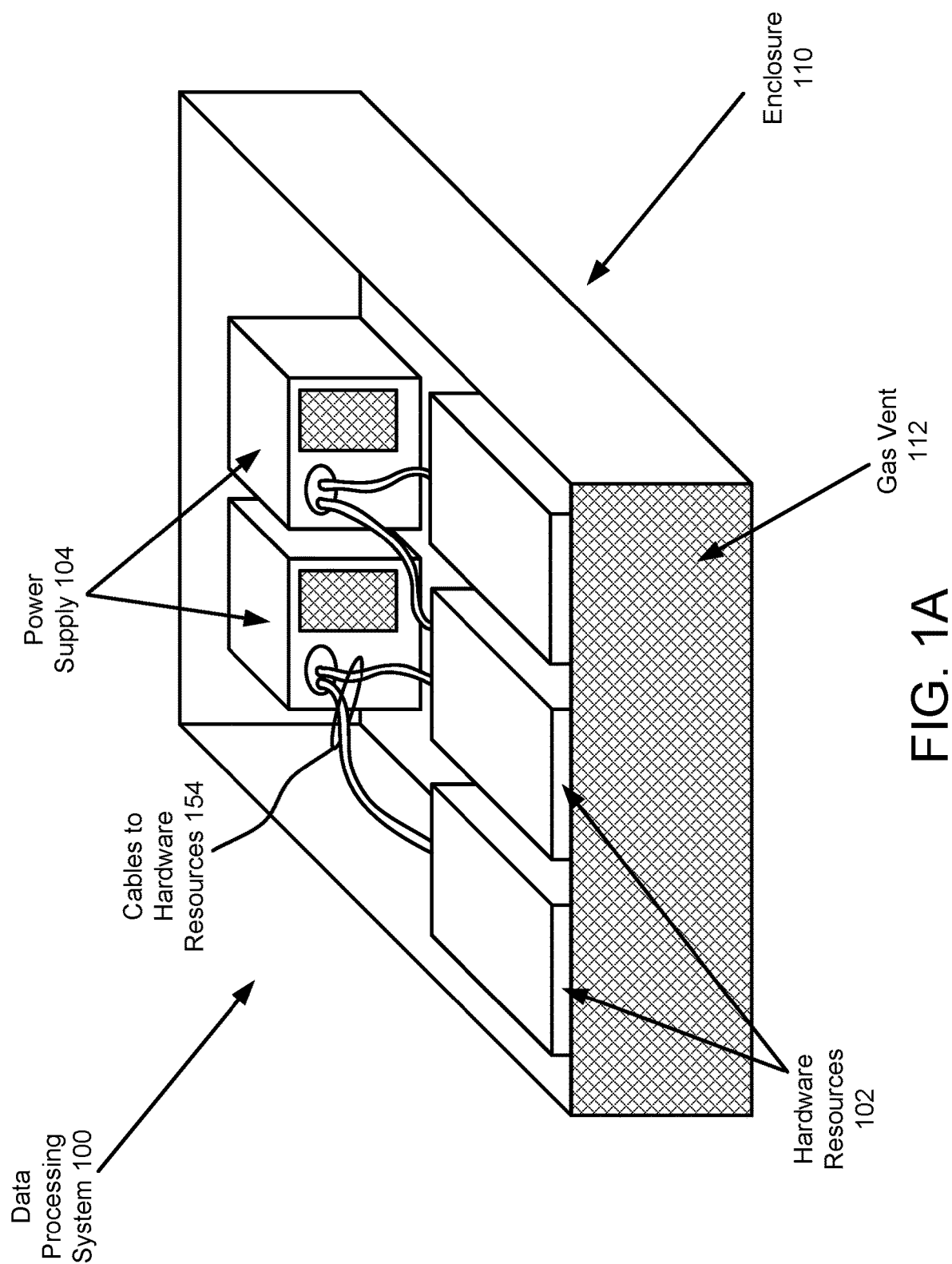
FIG. 1A shows a diagram illustrating a system in accordance with an embodiment.

Various embodiments and aspects of the disclosure will be described with reference to details discussed below, and the accompanying drawings will illustrate the various embodiments. The following description and drawings are illustrative of the embodiments and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

References to an "operable connection" or "operably connected" means that a particular device is able to communicate with one or more other devices, provide power to one or more devices, or otherwise interact with the one or more devices. The devices themselves may be directly connected to one another or may be indirectly connected to one another through any number of intermediary devices, such as in a network topology.

In general, embodiments of the invention relate to methods and systems for thermal management of components of a data processing system that may be used to provide computer implemented services. Specifically, the disclosed thermal management method and systems may improve the likelihood of data processing systems providing desired computer implemented services by improving the likelihood that desired power is provided by power supplies.

To improve the likelihood of power supplies providing desired power, the power supplies may proactively take into account the thermal environment and/or thermal states of components of the power supply. For example, the power supply may proactively take action to prevent components that are outside of their thermal operating ranges to operate and modify the thermal states of components to be within their thermal operating ranges.

To do so, the power supplies may actively heat various components of the power supplies when the temperatures of the components are below their rated operating temperatures. By doing so, the components may be less likely to attempt to operate while their temperatures are below their rated operating temperatures which may otherwise subject them to damage, degradation, and/or undesirable operation (e.g., improper operation).

By proactively thermally managing the power supplies, data processing systems may be more likely to be able to provide desired computer implemented services, may have a higher up time, may be less expensive to operate (e.g., by virtue of reduced component degradation/replacement), and may be operate over a wider range of operating conditions (e.g., which may allow for deployment to locations there may provide operational cost savings through passive, environmentally driven cooling).

In an embodiment, a power supply for powering a data processing system comprising hardware resources to provide computer implemented services is provided. The power supply may include a gas mover; a heating element; a primary power supply adapted to receive power from a source and provide conditioned power to the hardware resources while a temperature of the primary power supply exceeds a threshold temperature; a startup power supply adapted to receive the power from the source and selectively provide conditioned power to: the gas mover, and the heating element; and a power manager adapted to: prevent the primary power supply from attempting to provide the conditioned power while the temperature of the primary power supply is below the threshold temperature, and while the temperature of the primary power supply is below the threshold temperature: increase, with the gas mover, the heating element, and the startup power supply, the temperature of the primary power supply to exceed the threshold temperature.

Increasing the temperature of the primary power supply to exceed the threshold temperature may include locally heating, with the heating element and the startup power supply, the gas mover until a second temperature of the gas mover exceeds a second threshold temperature; after the temperature of the gas mover exceeds the second threshold temperature, initiating, with the gas mover, the heating element, and the startup power supply, heating of the primary power supply.

Initiating the heating of the primary power supply may include generating, with the gas mover, a flow of a gas towards the primary power supply; heating, with the heating element, the flow of the gas to obtain a heated gas flow; and initiating heat exchange between the heated gas flow and the primary power supply.

The power manager may be further adapted to, in response to the second temperature of the gas mover transitioning from being below the second threshold temperature to above the second threshold temperature: powering, with the startup power supply, the gas mover from an unpowered to a powered state; while the gas mover is in the powered state, performing an operational status check by applying a predetermined power sequence to the gas mover and measuring a mechanical response of the gas mover to the predetermined power sequence; when the operational status check indicates that the gas mover is in nominal operating condition, initiating the flow of the gas towards the primary power supply with the gas mover; and when the operational status check indicates that the gas mover is not in the nominal operating condition, delaying the initiating of the flow of the gas towards the primary power supply with the gas mover.

The second threshold temperature may be lower than the threshold temperature, the primary power supply may not be rated to operate at temperatures between the second threshold temperature and the threshold temperature, the startup power supply may be rated to operate at the temperatures between the second threshold temperature and the threshold temperature; and the startup power supply may be unable to power the hardware resources.

The heating element may be positioned to substantially exclusively heat the gas mover over the primary power supply while the heating element is powered by the startup power supply.

The power supply may also include an enclosure including two gas vents, the gas mover, the heating element, and at least a portion of the primary power supply may be positioned along a gas flow path between the two gas vents.

The power supply may also include a first temperature sensor positioned to measure the temperature of the primary power supply; and a second temperature sensor positioned to measure a second temperature of the gas mover. The first temperature sensors and the second temperature sensor may be adapted to provide the measurements of the temperature of the primary power supply and the second temperature of the gas mover to the power manager.

The first temperature sensor may be positioned with an exhaust gas vent of the two gas vents, and the threshold temperature may be greater than a minimum rated operating temperature of the primary power supply.

The gas mover may include a fan blade; and an electric motor coupled to the fan blade.

The heating element may include a heating wire positioned on an exhaust side of the gas mover, an intake side of the gas mover may be positioned to intake gases from outside of the power supply.

The heating wire may be distributed over the exhaust side of the gas mover to heat substantially all exhaust gas from the gas mover while the heating element and gas mover are operating.

In an embodiment, a data processing system to provide computer implemented services is provided. The data processing system may include hardware resources used to provide the computer implemented services; a power supply as discussed above.

In an embodiment, a method of operating hardware resources of a data processing system to provide computer implemented services is provided. The method may include identifying, by a power manager of a power supply of the data processing system, a power on event; determining, by the power manager, a thermal environment of the power supply; making a determination, by the power manager and based on the thermal environment, that the power supply is unable to complete a rapid start to power the hardware resources; based on the determination: remediating, with a startup power supply of the power supply, a heating element of the power supply, and a gas mover of the power supply, the thermal environment to place the power supply in condition for the rapid start; and performing, by the power manager, the rapid start of the power supply by initiating operation of a primary power supply of the power supply to supply power to the hardware resources.

Remediating the thermal environment to place the power supply in condition for the rapid start may include identifying, based on the thermal environment, a first thermal state of the gas mover of the power supply and a second thermal state of the primary power supply; making a second determination that the first thermal state indicates that the gas mover is subject to undesirable operation; based on the second determination: remediating the first thermal state of the gas mover using the heating element of the power supply and the startup power supply of the power supply to obtain a thermal state remediated gas mover; and remediating the second thermal state of the primary power supply using the thermal state remediated gas mover, the heating element, and the startup power supply.

The primary power supply may be rated to operate above a first threshold temperature, the startup power supply may be rated to operate above a second threshold temperature which is lower than the first threshold temperature, and the startup power supply may be unable to power the hardware resources.

Remediating the first thermal state may include powering the heating element with the startup power supply, the heating element may be positioned to substantially exclusively heat the gas mover over the primary power supply while the heating element is powered by the startup power supply.

In an embodiment, a non-transitory computer readable medium storing instructions that, when executed by a processor, cause a method is provided. The method may be similar to that discussed above and/or that performed by the power manager.

Turning to FIG. 1, a diagram illustrating a system in accordance with an embodiment is shown. The system shown in FIG. 1 may be used to provide computer implemented services. The system may include data processing system 100 and enclosure 110. Each of these components is discussed below.

Data processing system 100 may provide the computer implemented services. When doing so, data processing system 100 may consume electrical power from other sources (e.g., via power supply 104 or another device external to the data processing system, either of which may obtain power from a utility or other source). To provide the computer implemented services, data processing system 100 may include hardware resources 102 and power supply 104.

Hardware resources 102 may include any number of physical devices (e.g., processors, memory modules, storage devices, communications devices, etc.) that provide computing resources (e.g., processor cycles, transitory storage, persistent storage, communications bandwidth, etc.) usable to provide the computer implemented services. The computing resources may be used to support applications (e.g., computing instructions executing with the computing resources) hosted by data processing system 100. The applications may provide the computer implemented services. The computer implemented services may include any type and quantity of computer implemented services such as, for example, database services, data storage services, electronic communications services, etc. Data processing system 100 may provide other types of computer implemented services without departing from embodiments disclosed herein.

When operating, hardware resources 102 may consume electrical power to provide the computing resources used to provide the computer implemented services. The hardware resources may utilize power from power supply 104, and/or other sources. Power supply 104 may include any number of physical devices (e.g., transformers, current/voltage sensors, controllers, etc.) usable to obtain power from other power sources (not shown) and provide conditioned power to hardware resources 102 and/or other power components. The power obtained from the other power sources may be any form of power (e.g., alternating current, direct current) but the conditioned power may have specific characteristics (e.g., direct current of a predetermined voltage level) based on the hardware resources 102. For example, hardware resources 102 may not operate as expected when hardware resources 102 are provided with power that is not conditioned power.

Hardware resources 102 and/or power supply 104 may generate heat when providing their functionality. For example, hardware resources 102 may consume power when providing computing resources and generate heat as a byproduct. Generally, hardware resources 102 and/or other components of data processing system 100 may have associated thermal ranges in which the hardware resources 102 are capable of operating (e.g., at high reliability). If the temperatures of power supply 104 and/or various portions of hardware resources 102 fall outside of the thermal ranges, then power supply 104 may not provide desired conditioned power. For example, power supply 104 may not be able to provide any conditioned power, the provided power may not conform to the requirements for conditioned power, etc.

To facilitate thermal management via gas flows, enclosure 110 and/or power supply 104 (e.g., enclosures thereof) may include any number of gas vents 112. Gas vents 112 may be implemented with perforations or other types of structures through which gasses may flow. For example, power supply 104 may include inlet gas vents through which gasses are drawn in and exhaust gas vents through which gasses are exhausted thereby forming a gas flow path through power supply 104.

In general, embodiments disclosed herein relate to system, methods, and devices for improving the quality of computer implemented services provided by a data processing system. To do so, the data processing system manage the temperature of various components therein such that the operation of the components is less likely to be negatively impacted by the thermal environment to which the components are exposed. As noted above, various components such as power supply 104 may be susceptible to undesirable operation if the thermal environment to which power supply 104 exceed thermal limits of power supply 104, or portions thereof.

To reduce the impact of exposure of power supply 104 to thermal environment that may cause undesirable operations, power supply 104 may take action to modify the thermal environment to which its components are exposed. To do so, power supply 104 may (i) monitor the thermal environment to which its components are exposed, (ii) identify portions of its components that are unlikely to operate nominally (e.g., desirably) due to the thermal environments, (iii) prior to utilizing the identified portions of the components, modify the thermal environment to which the portion of the components are exposed such that the portion of components are less likely to operate outside of nominal operation, and (iv) initiate utilization of the portions of the components after the thermal environment to which the portions of the components has been exposed has been modified. By doing so, a power supply in accordance with an embodiment disclosed herein may be able to operate within thermal environment outside of which various components of the power supply are rated to operate. Thus, a power supply disclosed herein may be capable of operating in a broader range of thermal environments.

When operating, power supply 104 may provide power to hardware resources 102 thereby allowing for operation of hardware resources 102. Power supply 104 may be implemented with any number of physical devices for conditioning power for use and managing the operation of power supply 104. Refer to FIG. 1B for additional details regarding power supply 104.

Enclosure 110 may include a physical structure for housing data processing system 100. The physical structure may be a form factor compliant structure such as, for example, a rack mount enclosure for a server. The physical structure may be other types of structures for housing data processing systems without departing from embodiments disclosed herein.

Enclosure 110 may include any number of sub-enclosures such as, for example, server chassis sleds, internal blocks, and/or other structures in which various portions of hardware resources 102 are positioned. Enclosure 110 may include one or more of gas vents (e.g., 112) which may allow gasses to traverse through it. For example, a gas intake or exhaust may be implemented with a hole through enclosure 110. The hole may be entirely or partially covered with a grill, mesh, or other structure which may allow gasses to flow through the intake/exhaust while preventing objects of significant size from moving through the intake/exhaust. Fans (not shown) may be positioned with respect to the intake and/or exhaust on enclosure 110 (and/or in other locations) to facilitate gas flow through (e.g., in an intake and/or out of an exhaust) enclosure 110 along one or more paths. In this manner, cool gasses may be brought into enclosure 110 and heated gasses may be exhausted from enclosure 110 to facilitate management of the thermal environment inside of enclosure 110.

However, such thermal management may presume that the components within enclosure 110 are operating. If the components therein are shut off for a period of time, the thermal environment within enclosure 110 may cool or heat to a degree that portions of power supply 104 may not be able to desirably operate. Consequently, if a power supply is unable to modify its thermal environment, it may not be able to appropriately provide power to hardware resources 102 and/or other components following a power-on after a period of time that the data processing system 100 is off (e.g., depowered).

Figure 1B:
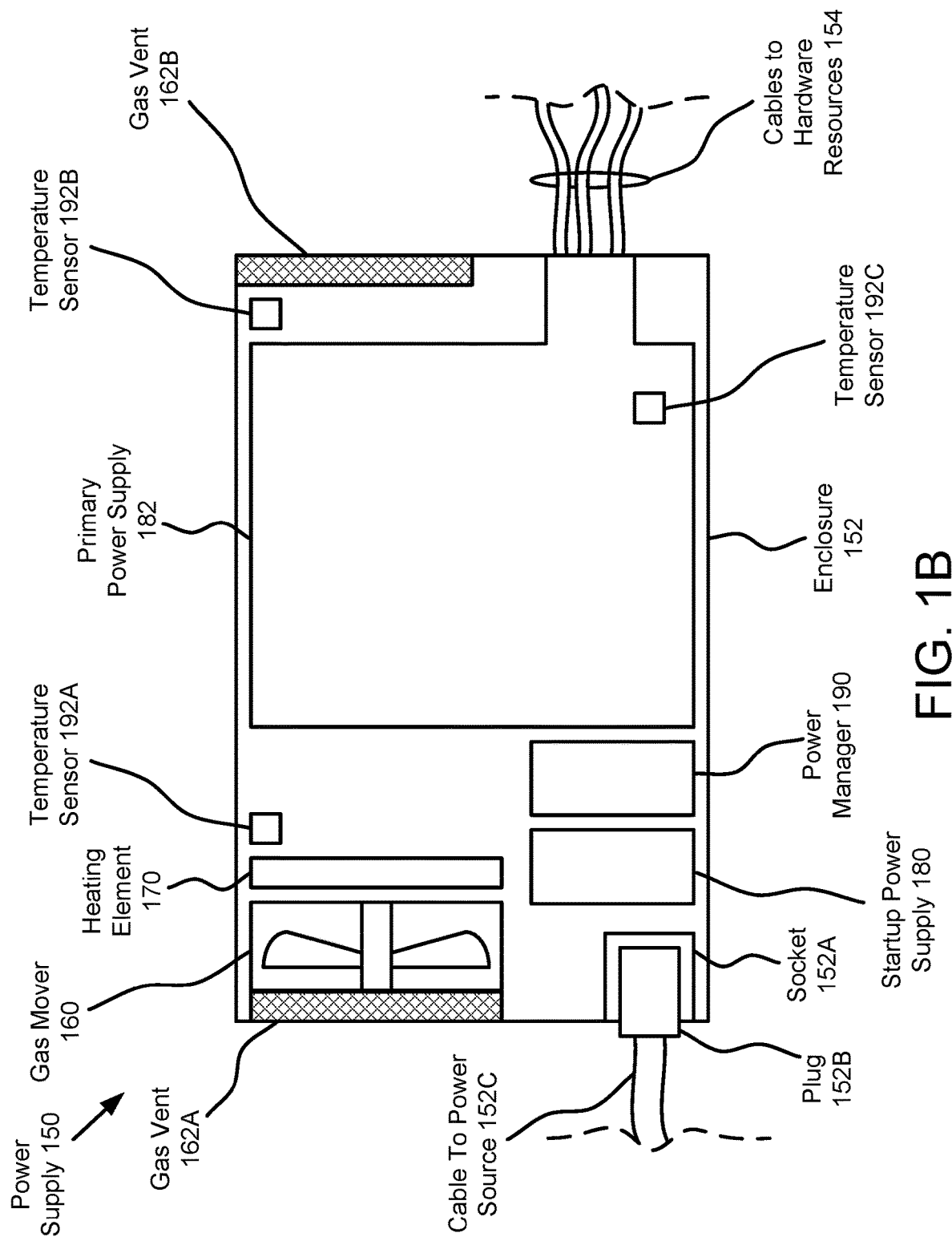
FIG. 1B shows a diagram illustrating a power supply in accordance with an embodiment.

While power supply 104 is depicted in FIG. 1A as being positioned within enclosure 110, power supply 104 may be positioned in other locations (e.g., outside of enclosure 110) without departing from embodiments disclosed herein. For example, power supply 104 may be implemented as a rack-level power supply. In such scenarios, the thermal environment within enclosure 110 may be of less relevance to the operation of power supply 104. Likewise, while illustrated with respect to a rack-type enclosure, enclosure 110 may be implemented with other form factors (e.g., blade enclosures, desk top enclosures, laptop enclosures, etc.) without departing from embodiments disclosed herein.

While gas vents 112 have been illustrated in FIG. 1A with cross hatch fill to highlight these sections, gas vents 112 may have other shapes, may be of different size, and may be positioned in other locations from those illustrated herein without departing from embodiments disclosed herein.

While the system of FIG. 1 has been illustrated as including a limited number of specific components, a system may include different numbers, types, and/or quantities of components without departing from the embodiments disclosed herein.

Turning to FIG. 1B, a diagram of power supply 150 in accordance with an embodiment is shown. FIG. 1B may show a top view depiction of power supply 150. Any of the power supplies illustrated in FIG. 1A may be similar to power supply 150.

As discussed above, power supply 150 may (i) provide conditioned power to other entities and (ii) manage its thermal environment to make it more likely that desired conditioned power will be provided to other entities. To provide this functionality, power supply 150 may include gas mover 160, heating element 170, startup power supply 180, primary power supply 182, and power manager 190. Each of these components is discussed below.

Startup power supply 180 may include one or more components for providing power to components of power supply 150. For example, startup power supply 180 may be adapted to provide power to gas mover 160, heating element 170, power manager 190, and/or other components of power supply 150.

Startup power supply 180 may have a limited capacity for supplying power and may be rated to provide conditioned power over a wide range of thermal conditions. For example, startup power supply 180 may generally include solid state components and/or other types of components that may be able to operate below the freezing point of water (e.g., below 0° Celcius (C)). For example, startup power supply 180 may have an operating range that extends down to −10° C., −20° C., −30° C., −40° C., etc. By virtue of inclusion of such components, the capacity for supplying power by startup power supply 180 may be limited. For example, startup power supply 180 may not be able to provide a sufficient quantity of power and/or at desired voltage/current levels to meet the needs of various hardware resources.

To supply power, startup power supply 180 may be operably connected to a power source via socket 152A, plug 152B, and cable to power source 152C. These components may be of any form factor compatible with the source of power. These components may also supply power from the sources to primary power supply 182, discussed in greater detail below.

While not illustrated in FIG. 1B, a switch or other control components may be positioned to operably connect and/or disconnect the source of power from power supply 150. For example, the switch may be positioned such that it selectively connects socket 152A to startup power supply 180 and/or primary power supply 182. Consequently, the switch may be utilized to depower power supply 150.

Primary power supply 182 may include one or more components for providing power to components outside of power supply 150. For example, primary power supply 182 may be adapted to provide power to hardware resources 102 and/or other components. Such components may utilize larger amounts of power than may be provided by startup power supply 180 and/or at different voltage/current levels than is provided by startup power supply 180.

Primary power supply 182 may have a larger capacity for supplying power than startup power supply 180 but may be rated to provide conditioned power over a narrower range of thermal conditions than startup power supply 180. For example, primary power supply 180 may include electrolytic components and/or other types of components that may be unable to operate below the freezing point of water (e.g., below 0° Celcius (C)) or even at higher temperatures. For example, primary power supply 182 may have an operating range that extends down to 0° C., 3° C., 5° C., etc. (e.g., "threshold temperature"). By virtue of inclusion of such components, the capacity for supplying power by primary power supply 180 may be limited by the thermal environment to which it is exposed. For example, primary power supply 182 may not be able to provide a sufficient quantity of power and/or at desired voltage/current levels to meet the needs of various hardware resources while its temperature is below the threshold temperature of primary power supply 182.

To supply power, primary power supply 180 may be operably connected to a power source via socket 152A, plug 152B, and cable to power source 152C and to component that will receive power through cables to hardware resources 154. These components may be of any form factor compatible with the source of power and the power receiving components.

The source of power that provides power to startup power supply 180 and primary power supply 182 may be any type (e.g., a utility, a rack-level power distribution unit, a battery-backup system, etc.). While illustrated in FIG. 1B with respect to one socket 152A, plug 152B and cable to power sources 152C, additional, different, and/or fewer components may be utilized to operably connect startup power supply 180 and/or primary power supply 182 to the source of power without departing from embodiments disclosed herein. The source of power may provide any type of power (e.g., direct current, alternating current, etc.) at any voltage and/or current levels.

The operation of primary power supply 182 and startup power supply 180 may be managed by power manager 190 (which may also manage the operation of gas mover 160, heating elements 170, and/or other components discussed below). For example, power manager 190 may manage when and to what extent startup power supply 180 and/or primary power supply 182 provide power to other entities. Power manager 190 may manage the power provided by power supplies 180, 182 via any mechanism without departing from embodiments disclosed herein.

When managing the operation of power supplies 180, 182, power manager 190 may take into account the thermal states of gas mover 160 and primary power supply 182. Because these components may have a more limited thermal operational range than startup power supply 180 and heating element 170, power manager 190 (i) determine the thermal states of gas mover 160 and primary power supply 182 and (ii) modify their thermal states prior to activating them. By doing so, power supply 150 may be more likely to be able to provide desired conditioned power, may be less likely to be damaged by virtue of its operation, may have an improved operational life, and/or may better facilitate providing of computing implemented services by increasing the likelihood of components that provide the computer implemented services being powered.

For example, when power supply 150 is powered-on (e.g., due to a startup of power supply 150, a restart of power supply 150, etc.), power manager 190 may obtain determine the thermal state of gas mover 160 and primary power supply 182. Power manager 190 may compare these thermal states to the rated thermal operating range of these components. If the thermal states of these components fall outside of the rated thermal operating ranges (or are near the boundaries of the thermal operating ranges such as with 5° C.), then power manager 190 may perform various action sets to remediate the thermal states of gas mover 160 and/or primary power supply 182 prior to initiating activation of these components.

If the thermal state of primary power supply 182 falls below its rated thermal operating range, then power manager 190 may utilize gas mover 160, heating element 170, and startup power supply 180 to heat primary power supply 182 until its thermal state falls within its rated thermal operating range (or within a prescribed narrower thermal range). Once within its rated thermal operating range, power manager 190 may discontinue heating of primary power supply 182 and initiate operation of primary power supply 182 such that it provides power to other components via cables to hardware resources 154.

To ascertain the thermal state of primary power supply 182, power manager 190 may utilize information obtained from one or more temperatures sensors, such as temperature sensor 192B and temperature sensor 192C. Temperature sensor 192B may be positioned proximate to gas vent 162B (e.g., an exhaust vent), and temperature readings from it may be used to infer the thermal state of primary power supply 182. For example, temperature sensor 192B may be downstream (e.g., along a gas flow path, refer to FIGS. 4A-4K for additional details regarding gas flow paths) from primary power supply 182. Consequently, it may be presumed that primary power supply 182 may be at a temperature similar to that measured via temperature sensor 192B. In contrast, temperature sensor 192C may be directly integrated with a portion of primary power supply 182. For example, temperature sensor 192C may be placed in contact with and/or substantially close to components of primary power supply 182 that limit its thermal operating range. Thus, temperature measurements from temperature sensor 192C may be treated as a direct measurement of the thermal state of primary power supply 182. While illustrated in FIG. 1B as being in a specific location and only being a singular temperature sensor, power supply 150 may include any number of temperature sensors placed with primary power supply 182 without departing from embodiments disclosed herein. One or more temperature measurements from these temperature sensors 192B, 192C may be used to ascertain the thermal state of primary power supply 182.

For example, if the information obtained from one or more of temperature sensors 192B, 192C is in conflict, power manager 190 may use an average, a weighted average, another type of statistic characterization of the temperature measurements, or may require that all temperature measurements indicate that the thermal state of primary power supply 182 is within its rated thermal operating range prior to allowing primary power supply 182 to operate (e.g., in part or entirety).

If the thermal state of gas mover 160 falls below its rated thermal operating range, then power manager 190 may utilize heating element 170 and startup power supply 180 to gas mover 160 until its thermal state falls within its rated thermal operating range (or within a prescribed narrower thermal range). Once within its rated thermal operating range, power manager 190 may utilize gas mover 160 to initiating heating of primary power supply 182.

For example, heating element 170 may be positioned such that it is able to heat gas mover 160 without substantially heating primary power supply 182. Heating element 170 may have a limited local heating capacity. Once gas mover 160 is heated with heating element 170, then gas mover 160 may generate a gas flow towards heating element 170 and primary power supply 182. As the gas flow passes proximate to heating element 170, thermal exchange may occur thereby heating the gas flow. When the heated gas flow passes proximate to primary power supply 182, thermal exchange may also occur thereby heating primary power supply 182.

To ascertain the thermal state of gas mover 160, power manager 190 may utilize information obtained from one or more temperatures sensors, such as temperature sensor 192A. Temperature sensor 192A may be positioned proximate to gas mover 160, and temperature readings from it may be used to infer the thermal state of gas mover 160. While illustrated in FIG. 1B as being in a specific location and only being a singular temperature sensor, power supply 150 may include any number of temperature sensors placed with gas mover 160 without departing from embodiments disclosed herein. One or more temperature measurements from these temperature sensors may be used to ascertain the thermal state of gas mover 160. This process may be similar to that discussed above with respect to temperature sensors 192B, 192C.

In an embodiment, power manager 190 is implemented with one or more circuits. For example, the circuits may (i) receive voltage or current representations of the temperature measurements from temperature sensors 192A, 192B, 192C, (ii) use comparators or other circuits to compare the voltage and/or current representations to reference levels corresponding to lower level of the thermal operating ranges of gas mover 160 and primary power supply 182, and (iii) use the results of the comparisons to selectively activate/deactivate functionality of startup power supply 180 and/or primary power supply 182. For example, the results of the comparisons may be used to invoke power providing functionality of startup power supply 180 to selectively activate/deactivate heating element 170 and gas mover 160 based on the temperature measurements of temperature sensors 192A, 192B, and 192C. Likewise, the results of the comparisons may be used to invoke power providing functionality of primary power supply 182. By doing so, power manager 190 may perform all, or a portion, of the methods illustrated in FIGS. 3A-3B.

In an embodiment, power manager 190 is implemented with a computing device such as an embedded computer, a microcontroller, a digital signal processor, a host or server, a personal computer (e.g., desktops, laptops, and tablets), and/or any other type of data processing device or system. For additional details regarding computing devices, refer to FIG. 5.

Temperature sensors 192A, 192B, 192C may be implemented with physical devices (e.g., circuits) that include functionality to measure temperatures and/or report temperature measurements to other devices. For example, the temperature sensors may include or may be operably connected to thermocouples that generate electromagnetic signals corresponding to temperature measurements, one or more signal processing elements that process the generated electromagnetic signals (e.g., into prescribed voltage/signal ranges expected by users of the temperature measurements), and/or one or more data transmission elements that may transmit analog and/or digital representations of the temperature measurements. The measurements may be transmitted to power manager 190 and/or other entities.

Gas mover 160 may be implemented with one or more physical devices that include functionality to selectively generate gas flows. For example, gas mover 160 may be implemented with a fan that includes blades mechanically coupled to an electric motor. The fan may generate different gas flow rates depending on the rate of rotation of the electric motor. The electric motor may be driven by startup power supply 180. Consequently, when and the strength of the gas flow generated by gas mover 160 may be controlled by provisioning of power to it via startup power supply 180. While described with respect to a fan, gas mover 160 may be implemented with other types of devices for generating gas flows without departing from embodiments disclosed herein.

Heating element 170 may be implemented with one or more physical devices that include functionality to selectively generate heat. For example, heating element 170 may be implemented with a resistive coil (e.g., of resistive wire or other structure) or other type of structure that takes electrical current as an input and generates heat as an output. While described with respect to a resistive coil, heating element 170 may be implemented with other types of devices for generating heat without departing from embodiments disclosed herein.

Figure 4A:
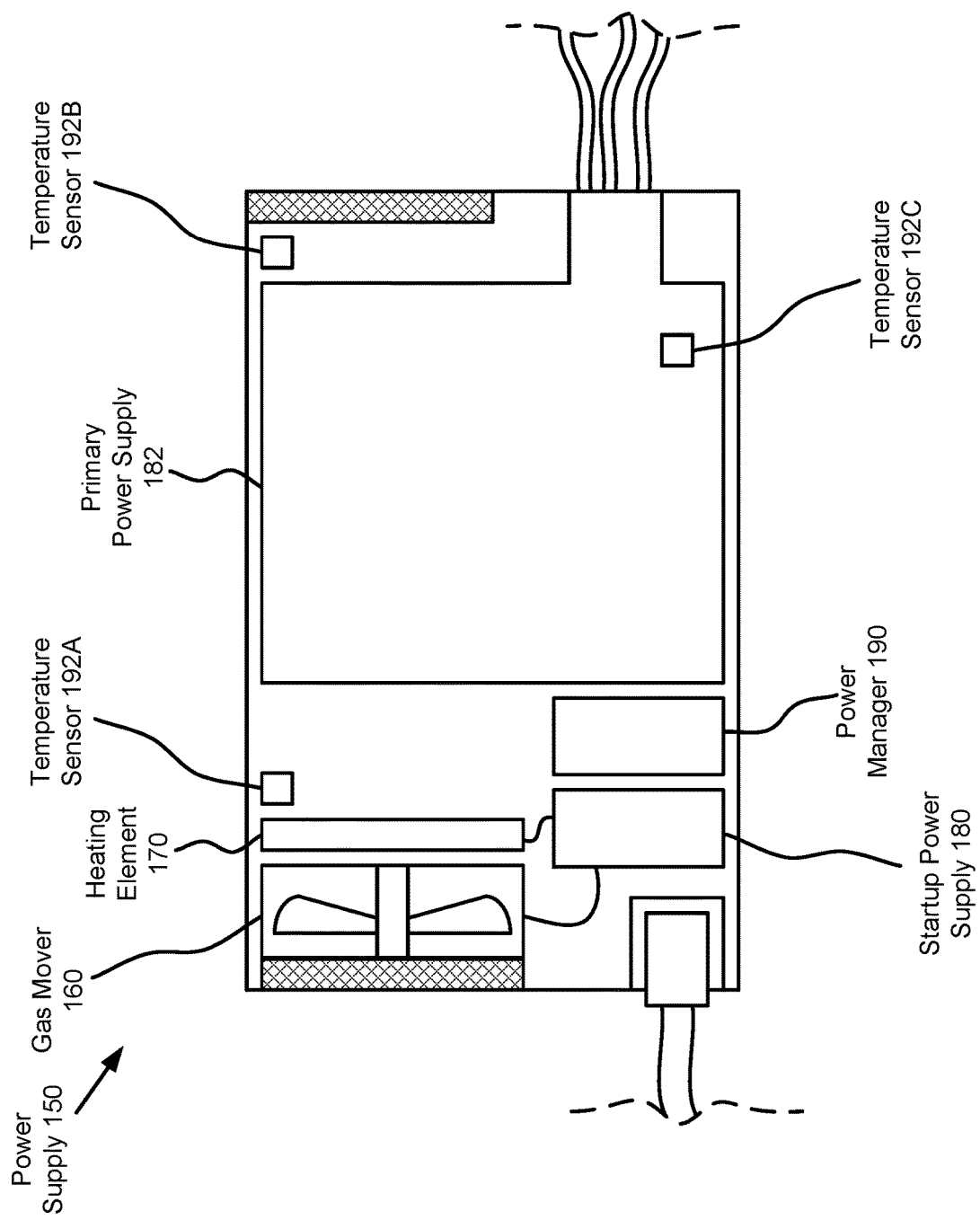
FIGS. 4A-4K show diagrams illustrating a process performed by an example system in accordance with an embodiment.
Figure 4B:
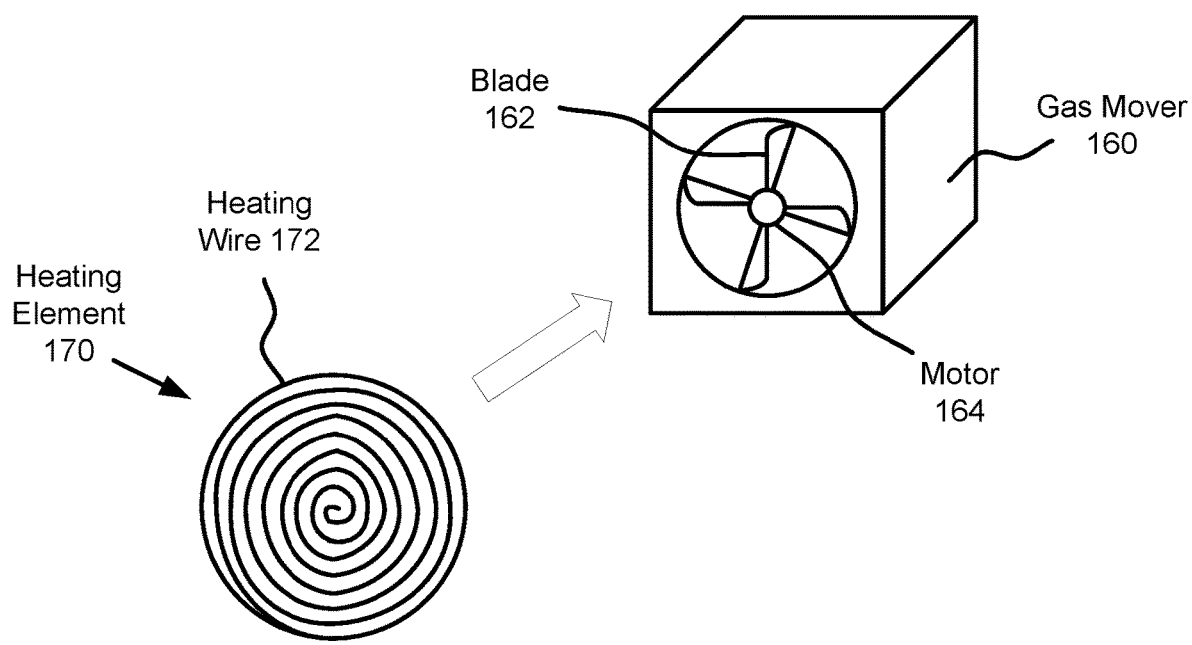
Figure 4C:
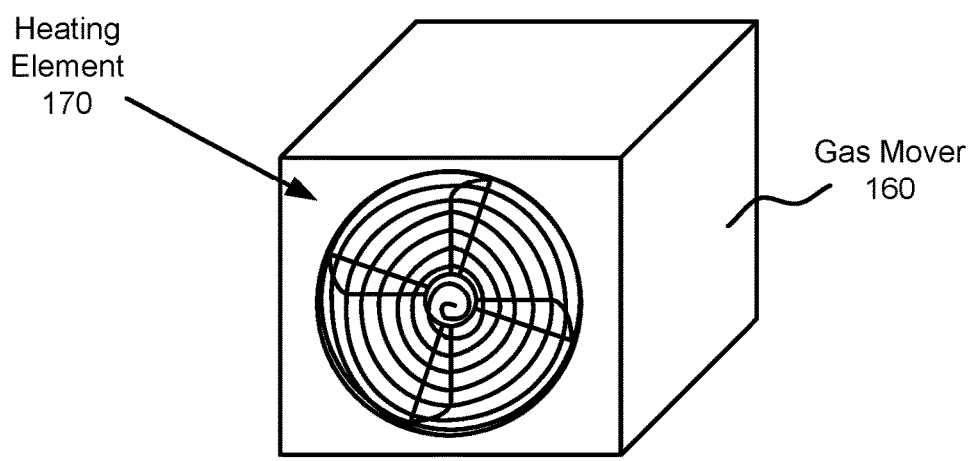

Heating element 170 may be positioned proximate to gas mover 160 so that gas mover 160 is substantially exclusively heated by heating element 170 while gas mover 160 is not operating. While heating element 170 may incidentally heat other components (e.g., 182, 180, 190), the heating may be small when compared to the heating of gas mover 160 by heating element. Refer to FIGS. 4B-4C for an example implementation of heating element 170 with gas mover 160.

Generally, gas mover 160, heating element 170, and primary power supply may be positioned (in part or entirely) along a gas flow path through power supply 150. For example, gas mover 160 may be positioned proximate to gas vent 162A (e.g., an inlet vent) such that when gas mover 160 operates a flow of gas is drawn into power supply 150 (e.g., into an enclosure 152 of power supply 150) through gas vent 162A. The gas flow may generally be directed toward gas vent 162B (though the gas flow may interact with other components not directly in-line with gas vents 162A, 162B). Heating element 170 and primary power supply 182 may be positioned along the gas flow to facilitate heating of primary power supply 182 when gas mover 160 and heating element 170 are operating.

While illustrated in FIG. 1B with a limited number of specific components, a power supply may include additional, fewer, and/or different components without departing from embodiments disclosed herein.

Figure 2:
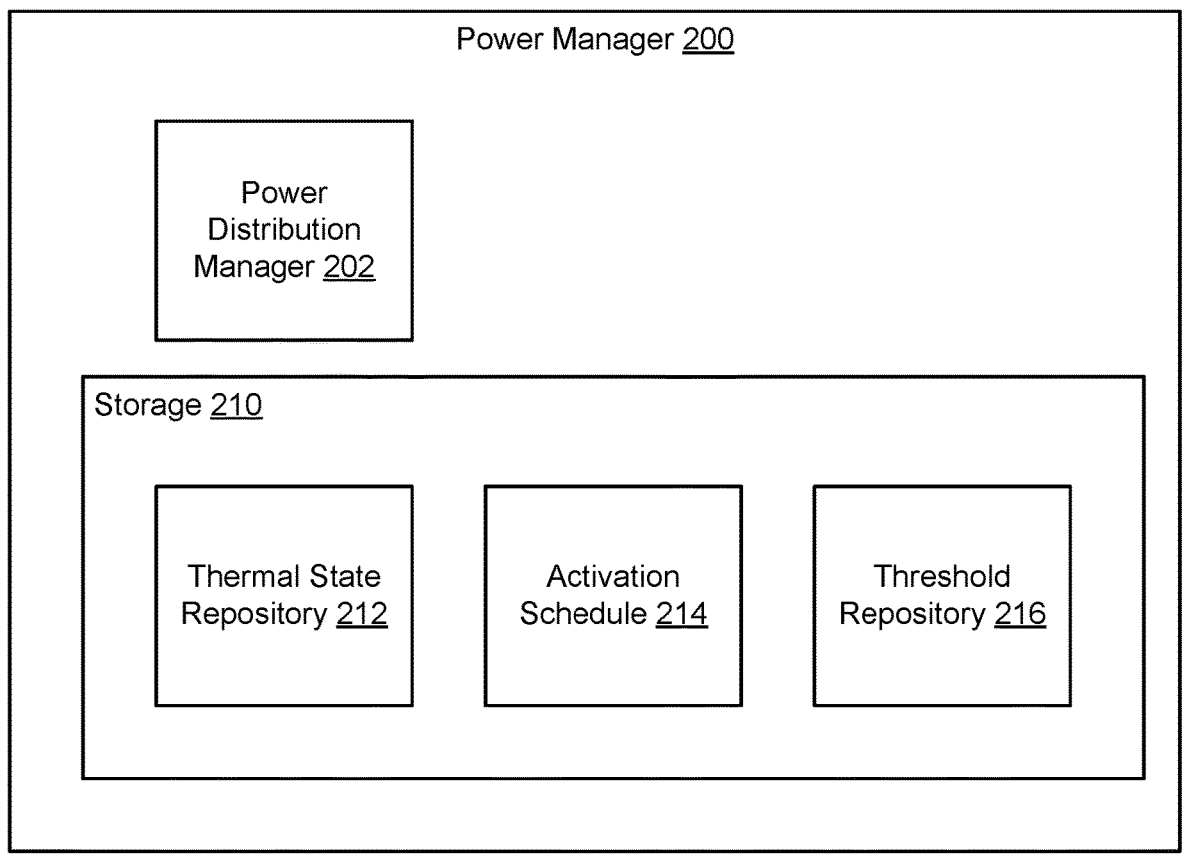
FIG. 2 shows a block diagram illustrating a power manager in accordance with an embodiment.

Turning to FIG. 2, a block diagram of power manager 200 in accordance with an embodiment is shown. Power manager 200 may be similar to power manager 190. As discussed above, power manager 200 may manage the operation of various components of power supply 150 based on the thermal state of power supply 150.

To provide its functionality, power manager 200 may include power distribution manager 202 and storage 210. Each of these components is discussed below.

Power distribution manager 202 may manage the distribution of power within and outside of power supply 150. To do so, power distribution manager 202 may (i) obtain information regarding the thermal states of gas movers and primary power supplies (e.g., which may be used to update thermal state repository 212), (ii) compare the thermal states to information included in activation schedule 214 and/or threshold repository 216 to ascertain when the functionality of various components is to be performed based on the thermal states of the components, and (iii) invoke the functionality of gas movers, heating elements, startup power supplies, primary power supplies, and/or other components of power supply 150 based on the ascertained points in time to invoke the functionalities of these components. By doing so, power distribution manager 202 may manage the startup of power supply 150 in a manner that makes it more likely that power supply 150 will provide requested quantities of power and limit (or prevent) damage to power supply 150 for providing the requested quantities of power. Consequently, the operational and/or useful life of a data processing system that relies on power supply 150 may be improved while it is operated in environment which may cause various components of power supply 150 to exceed their (e.g., lower) thermal limits.

Power distribution manager 202 may manage the operation of other components using any command and control scheme. For example, power distribution manager 202 may invoke the functionalities of other components by applying analog voltages to them, by sending them digital data indicating invocation of their functionalities, and/or through other schemes (e.g., message passing, public-subscribe communication systems, synchronous/asynchronous operation, state machines, etc.).

In an embodiment, power distribution manager 202 is implemented using a hardware device including circuitry. The hardware device may be, for example, a digital signal processor, a field programmable gate array, or an application specific integrated circuit. The circuitry may be adapted to cause the hardware device to perform the functionality of power distribution manager 202. Power distribution manager 202 may be implemented using other types of hardware devices without departing embodiment disclosed herein.

In an embodiment, power distribution manager 202 is implemented using a processor adapted to execute computing code stored on a persistent storage that when executed by the processor performs the functionality of power distribution manager 202 discussed throughout this application. The processor may be a hardware processor including circuitry such as, for example, a central processing unit, a processing core, or a microcontroller. The processor may be other types of hardware devices for processing information without departing embodiment disclosed herein.

Figure 3A:
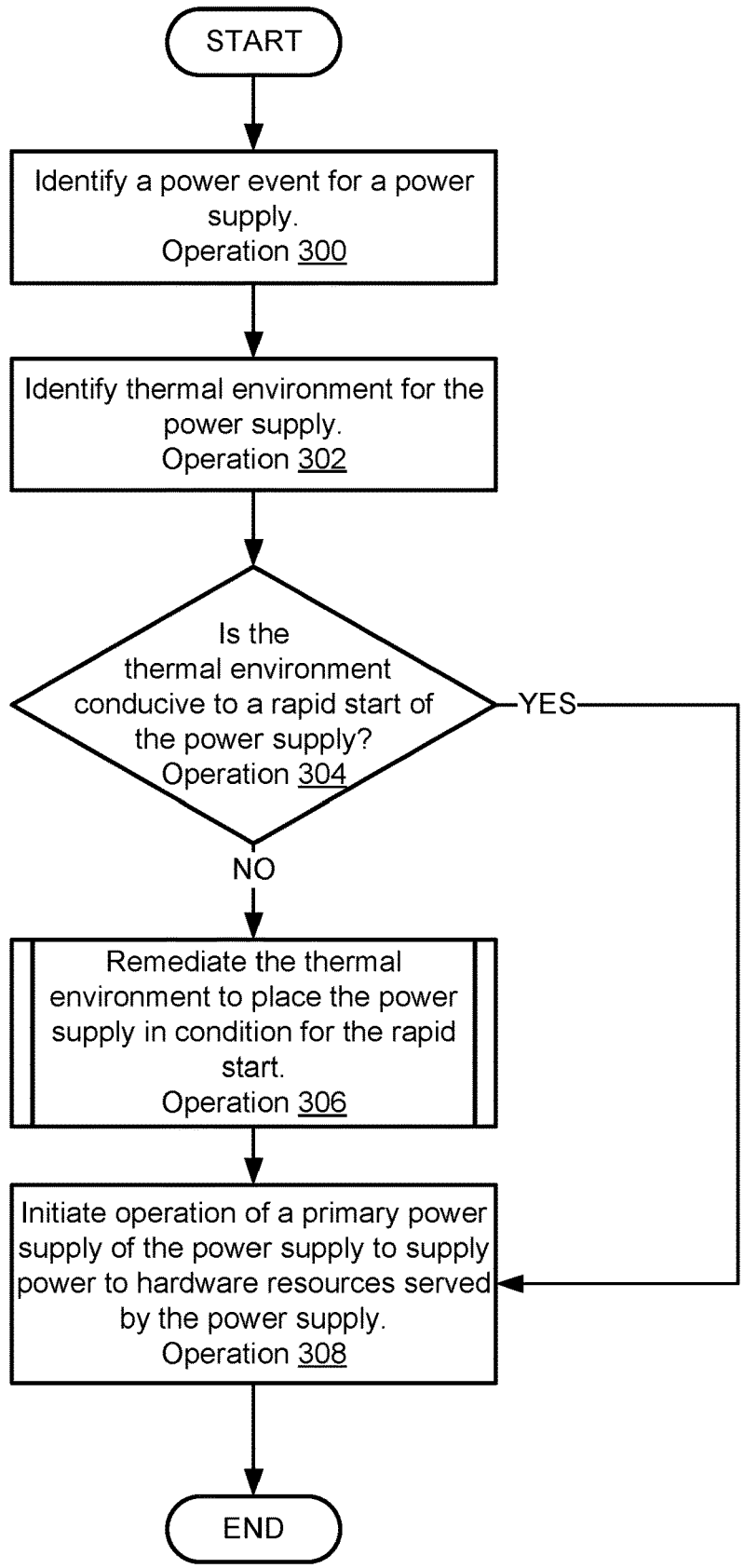
FIG. 3A shows a flow diagram illustrating a method of powering a data processing system in accordance with an embodiment.
Figure 3B:
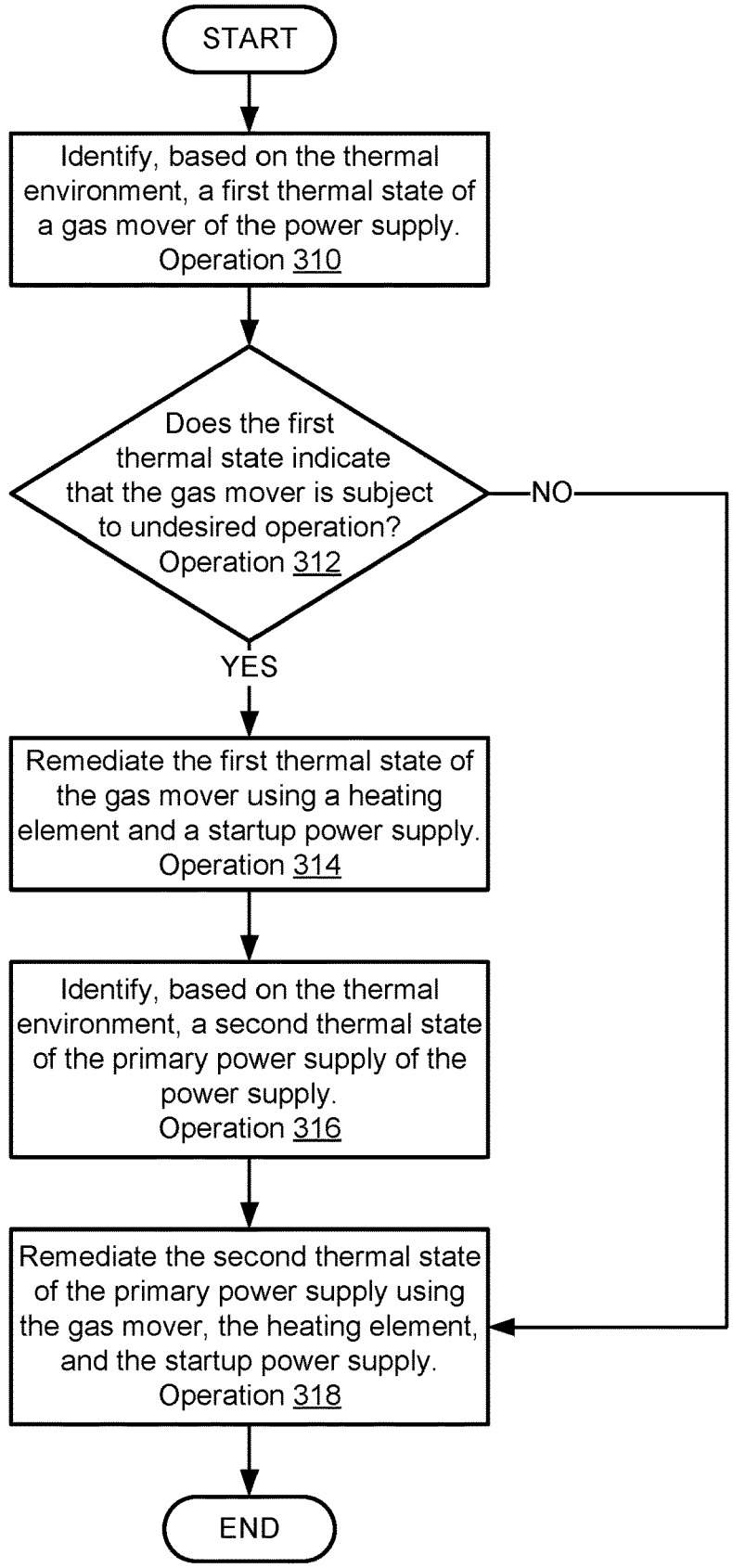
FIG. 3B shows a flow diagram illustrating a method of remediating a thermal environment in accordance with an embodiment.

When providing its functionality, power distribution manager 202 may perform all, or a portion, of the methods illustrated in FIGS. 3A-3B as well as any of the actions, operation, etc. shown in FIGS. 4A-4K.

In an embodiment, storage 210 is implemented using physical devices that provide data storage services (e.g., storing data and providing copies of previously stored data). The devices that provide data storage services may include hardware devices and/or logical devices. For example, storage 210 may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage 210 may include a memory device (e.g., a dual in line memory device) in which data is stored and from which copies of previously stored data are provided. In another example, storage 210 may include a persistent storage device (e.g., a solid-state disk drive) in which data is stored and from which copies of previously stored data is provided. In a still further example, storage 210 may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Storage 210 may also be implemented using logical storage. A logical storage (e.g., virtual disk) may be implemented using one or more physical storage devices whose storage resources (all, or a portion) are allocated for use using a software layer. Thus, a logical storage may include both physical storage devices and an entity executing on a processor or other hardware device that allocates the storage resources of the physical storage devices.

In an embodiment, storage 210 is implemented with one or more registers in which values corresponding to thresholds/actions to be performed are stored.

In an embodiment, storage 210 is implemented with one or more circuits in which information is hard coded.

In an embodiment, storage 210 is implemented with programmable gate arrays, programmable read only memory, and/or other types of embedded storage devices.

Storage 210 may be implemented with other types of physical devices in which data may be stored without departing from embodiments disclosed herein.

Storage 210 may store data structures including thermal state repository 212, activation schedule 214, and/or threshold repository. Each of these data structures is discussed below.

Thermal state repository 212 may be implemented using one or more data structures that include information regarding the thermal states of any number of components of power supply 150. The repository may be updated over time based on information obtained from temperature sensors. In an embodiment, thermal state repository 212 is implemented with a list including any number of entries. Each entry may correspond to one or more components of power supply 150. Each entry may specify a thermal state of the corresponding one or more components. For example, each entry may specify a corresponding temperature of the one or more components. An identifier of component(s) corresponding to the entries may be used as a key to perform a lookup. The lookup may return the thermal state for the corresponding one or more components.

Activation schedule 214 may be implemented using one or more data structures that include information regarding when various functionalities of components of power supply 150 are to be active. The functionalities may be keyed to corresponding thermal states. Thus, a thermal state for a component may be used to lookup which of its functionalities are to be activated. The activation schedule 214 may be based on the thermal operating ranges of the components.

For example, the activation schedule 214 may specify that a gas mover is not to operate outside of its thermal range and it to operate while within its thermal range. In another example, the activation schedule 214 may specify that a heating element is to be active while a gas mover and/or primary power supply are outside (e.g., below) their thermal operating ranges and is to be inactive while both the gas mover and/or primary power supply are within their thermal operating ranges. Similarly, activation schedule 214 may specify that a primary power supply is only to be operational while within its thermal operating range.

Threshold repository 216 may be implemented using one or more data structures that include information regarding actions to be performed based on the thermal states of components of power supply 150. The actions may include, for example, (i) activating a heating element while a gas mover and primary power supply are below their thermal operating ranges, (ii) activing a heating element and gas mover while the primary power supply is below its thermal operating range but the gas mover is within its thermal operating range, and (iii) deactivating the heating element while retaining operation of the gas mover while the gas mover and primary power supply are both within their thermal operating ranges. Threshold repository 216 may include any number of thresholds. The thresholds may correspond to lowest thermal operating ranges of corresponding components, which may have different thermal operating ranges.

While various data structures have been illustrated and described in FIG. 2 with specific structures, any of the data structures may be implemented with different structures (e.g., lists, tables, linked lists, databases, etc.), stored in different locations, spanned across any number of devices, and/or may include additional, different, and/or less information without departing from embodiments disclosed herein.

While illustrated in FIG. 2 with a limited number of specific components, a power manager 200 may include additional, fewer, and/or different components without departing from embodiments disclosed herein.

While power manager 200 has been described with respect to programmable functionality, the functionality of power manager 200 may be implemented with (in part or entirely) circuits that perform equivalent functions and may not include or may include fewer programmable components.

As discussed above, the components of FIG. 1 may perform various methods to manage thermal environments in a data processing system. FIGS. 3A-3B illustrate examples of methods that may be performed by the components of FIG. 1. In the diagrams discussed below and shown in FIGS. 3A-3B, any of the operations may be repeated, performed in different orders, and/or performed in parallel with or a partially overlapping in time manner with other operations.

Turning to FIG. 3A, a flow diagram illustrating a method of operating a data processing device to provide computer implemented services in accordance with an embodiment is shown. The method may be performed, for example, when a data processing system is initialized, restarted, or at any other time during which there may be a threat of the thermal environment of the data processing system not being conducive to operation of components of the data processing system. For example, the method shown in FIG. 3A may be performed when a data processing system and/or power supply that provides power to the data processing system may be exposed to a thermal environment that may cool components of the power supply below their rated thermal operating range.

At operation 300, a power event for a power supply of the data processing system is identified. The power event may be, for example, a power cycling, power-on, or other type of event that indicates that the power supply is to provide power to other devices. The power event may be identified, for example, based on changes in power to the power supply, based on information provided by other entities (e.g., a management entity of a host/client data processing system), or via other methods.

At operation 302, the thermal environment for the power supply is identified. The thermal environment may be identified by obtaining temperature measurements. The temperature measurements may indicate the thermal state (e.g., temperature) of various components of the power supply. These components may include, for example, a gas mover and a primary power supply of the power supply.

In an embodiment, the temperature measurements are used to infer the temperature of corresponding components. For example, the temperature measurements may not be direct measurements of the components. Rather, the temperature measurements may be taken proximate to, downstream from, or otherwise may be indirect temperature measurements. The temperature measurements may be used to infer the temperatures of the components using, for example, functions that take into account physical separations between the temperature sensors and the components.

The thermal environment for the power supply by may be used to populate a repository (e.g., 212) and/or may be used directly in subsequent processing.

At operation 304, a determination is made regarding whether the thermal environment is conducive to a rapid start of the power supply. A rapid start of the power supply may include immediately invoke power distribution functionality of a primary power supply. When so invoke, the primary power supply may attempt to begin to immediately provide power to power consumers such as hardware resources. However, as noted above, the primary power supply may be unlikely to successfully provide power to power consumers when its thermal state lies outside of its thermal operating range. If the thermal state of the primary power supply lies outside of the thermal operating range, then it may be determined that the thermal environment is not conducive to a rapid start of the power supply. The determination may be made, for example, by comparing the thermal state of the primary power supply to its corresponding thermal operating range.

For example, information from the thermal state repository 212 may be compared to information in the activation schedule 214 and/or threshold repository 216 to make the determination.

If it is determined that the thermal environment is not conducive to the rapid start, then the method may proceed to operation 306. Otherwise, the method may proceed to operation 308.

At operation 306, the thermal environment is remediated to place the power supply in condition for the rapid start. The thermal environment may be remediated by heating the power supply using a startup power supply of the power supply, a heating element of the power supply, and/or a gas mover of the power supply. The power supply may be heated until the thermal state of the primary power supply is within its thermal operating range (or a narrower range to provide for a factor of safety and/or other consideration).

In an embodiment, the thermal environment is remediated via the method illustrated in FIG. 3B. The thermal environment may be remediated via other methods without departing from embodiments disclosed herein.

During operations 300-306, the power supply may not provide power even though it has been instructed, requested, or otherwise indicated to provide power to other components. Thus, there may be some time delay between when power is requested and power is actually provided while the power supply has a corresponding thermal environment.

At operation 308, operation of the primary power supply of the power supply is initiated. Initiating the primary power supply may supply power to hardware resources served by the power supply. The operation of the primary power supply may be initiated, for example, by sending control signals to the primary power supply (or other management components) that cause it to being to provide conditioned power and consume power from a power source.

The method may end following operation 308.

By performing the method illustrated in FIG. 3A, a data processing system and power supply thereof may be more likely to successfully provide computer implemented services by improving the likelihood that the power supply is able to provide desired conditioned power during environmental conditions that would otherwise negatively impact the operation of the power supply. Thus, an improved computing device and power supply thereof that are better able to operate in varying environmental conditions may be provided.

Turning to FIG. 3B, a flow diagram illustrating a method of remediating a thermal environment in accordance with an embodiment is shown.

At operation 310, a first thermal state of a gas mover of the power supply is identified based on the thermal environment. For example, the temperature of the gas mover (e.g., inferred temperature) may be measured using a temperature sensor or a previous measurement of the temperature may be read into memory or otherwise place in condition for use.

At operation 312, a determination is made regarding whether the first thermal state indicates that the gas mover is subject to undesired operation. The determination may be made by comparing the temperature of the gas mover to the thermal operating range of the gas mover (e.g., which may be stored in a repository, as a reference voltage, etc.). If the temperature of the gas mover is below the thermal operating range of the gas mover, then it may be determined that the gas mover is subject to undesired operation. For example, when the temperature of the gas mover is below its thermal operating range, the gas mover may be subject to degradation such as fracturing due to materials used in its construction becoming more brittle, improper operation due to the formation of ice or other materials that may block or otherwise prevent its operation, and/or other undesired outcomes.

If it is determined that the first thermal state indicates that the gas mover is subject to undesired operation, then the method may proceed to operation 314. Otherwise the method may proceed to operation 318.

At operation 314, the first thermal state of the gas mover is remediating using a heating element and a startup power supply. The first thermal state may be remediated by supplying power to the heating element. When powered, the heating element may generate heat thereby raising the temperature of the gas mover. The temperature of the gas mover may be raised until it falls within the thermal operating range (or a narrower range to provide for a factor of safety) of the gas mover.

In an embodiment, once the temperature of the gas mover is placed into its thermal operating range, the gas mover may be subjected to a test sequence of operations to ascertain whether it is operational. The test sequence may include supplying voltage/current to the gas mover and measuring its rate of rotation or other mechanical action measured with tachometers or other sensors. The rate of mechanical action may be compared to reference values. If the mechanical action appears nominal (e.g., normal, desirable, etc.) in view of the reference values, then the method may proceed to operation 316. If the mechanical action does not appear nominal, then the gas mover may continue to be heated to incrementally higher temperatures (e.g., increments of approximately 5°) and subjected to the test sequence until its operation appears nominal. Then the method may proceed to operation 316.

At operation 316, a second thermal state of the primary power supply of the power supply is identified based on the thermal environment. For example, a temperature of the primary power supply may be measured. The measured temperature may fall below the thermal operating range of the primary power supply which may indicate that the primary power supply may not be operated.

At operation 318, the second thermal state of the primary power supply is remediating using the thermal state remediated gas mover, the heating element, and the startup power supply. The second thermal state may be remediated by supplying power to the heating element and the gas mover. When powered, the heating element may generate heat and the gas mover may generate a flow of gas that applies the generated heat to the primary power supply thereby raising the temperature of the primary power supply. The temperature of the primary power supply may be raised until it falls within the thermal operating range (or a narrower range to provide for a factor of safety) of the primary power supply.

In an embodiment, once the temperature of the primary power supply is placed into its thermal operating range, the primary power supply may be subjected to a test sequence of operations to ascertain whether it is operational. The test sequence may include invoking voltage/current supply by the primary power supply and measuring its rate of current/voltage supply. The rate of current/voltage supply may be compared to reference values. If the rate of supply appears nominal (e.g., normal, desirable, etc.) in view of the reference values, then the method may end following operation 318. If the rate of supply does not appear nominal, then the primary power supply may continue to be heated to incrementally higher temperatures (e.g., increments of approximately 5°) and subjected to the test sequence until its operation appears nominal. Then the method may end.

Following operation 318, the heating element may be depowered.

Using the method illustrated in FIG. 3B, a power supply may initiate the process of providing power in a manner that allows it to utilize components with narrower thermal operating ranges while still being able to provide power to other components when the components are placed in thermal states that fall below their thermal operating ranges.

Turning to FIGS. 4A-4K, diagrams illustrating operation of a system similar to that shown in FIGS. 1A-1B in accordance with an embodiment are shown. In FIGS. 4A-4K, operations performed by the respective components are highlighted with numbered circular elements superimposed on the components performing the operations. Interactions between components are illustrated using arrows with dashed tails. Lastly, in some figures, gas mover Now, consider an example scenario in which a data processing system is off and includes power supply 150. Primary power supply 182 and gas mover 160 may only be rated to operate between 0 to 100°. In contrast, heating element 170 and startup power supply 180 may be rated to operate between −40° to 100°.

Being off, the components of power supply may begin to cool until they each reach the ambient temperature of −33°. At this temperature, primary power supply 182 may be unable to operate. To ensure that power supply 150 may be able to operate even in such ambient conditions, heating element 170 and gas mover 160 may be adapted to heat primary power supply 182.

For example, turning to FIGS. 4B-4C, an example implementation of heating element 170 and gas mover 160 in accordance with an embodiment is shown. Heating element 170 may be implemented with a heating wire 172 that is spiraled across a surface corresponding to an exhaust port of gas mover 160. Gas mover 160 may include any number of blade 162 and motor 164. When heating element 170 is positioned with the exhaust port, as illustrated in FIG. 4C, heating element 170 may be capable of locally heating blade 162 and motor 164 such that they may be warmed above the ambient temperature and within the rated thermal operating range of the components. After warming, motor 164 may drive blade 162 to create a gas flow that passes through heating element 170 thereby causing thermal exchange to occur resulting in the generation of a warmed gas flow that is heated above the ambient conditions. Both heating element 170 and gas mover 160 may be powered with startup power supply 180 which may be able to operate to even lower temperatures, but may only be able to supply a limited quantity of power (e.g., insufficient to power other components/devices).

Returning to FIG. 4A, after being cooled to the ambient temperature of −33°, at a first point in time power supply 150 is powered thereby indicating that power is to be provided to other components.

Figure 4D:
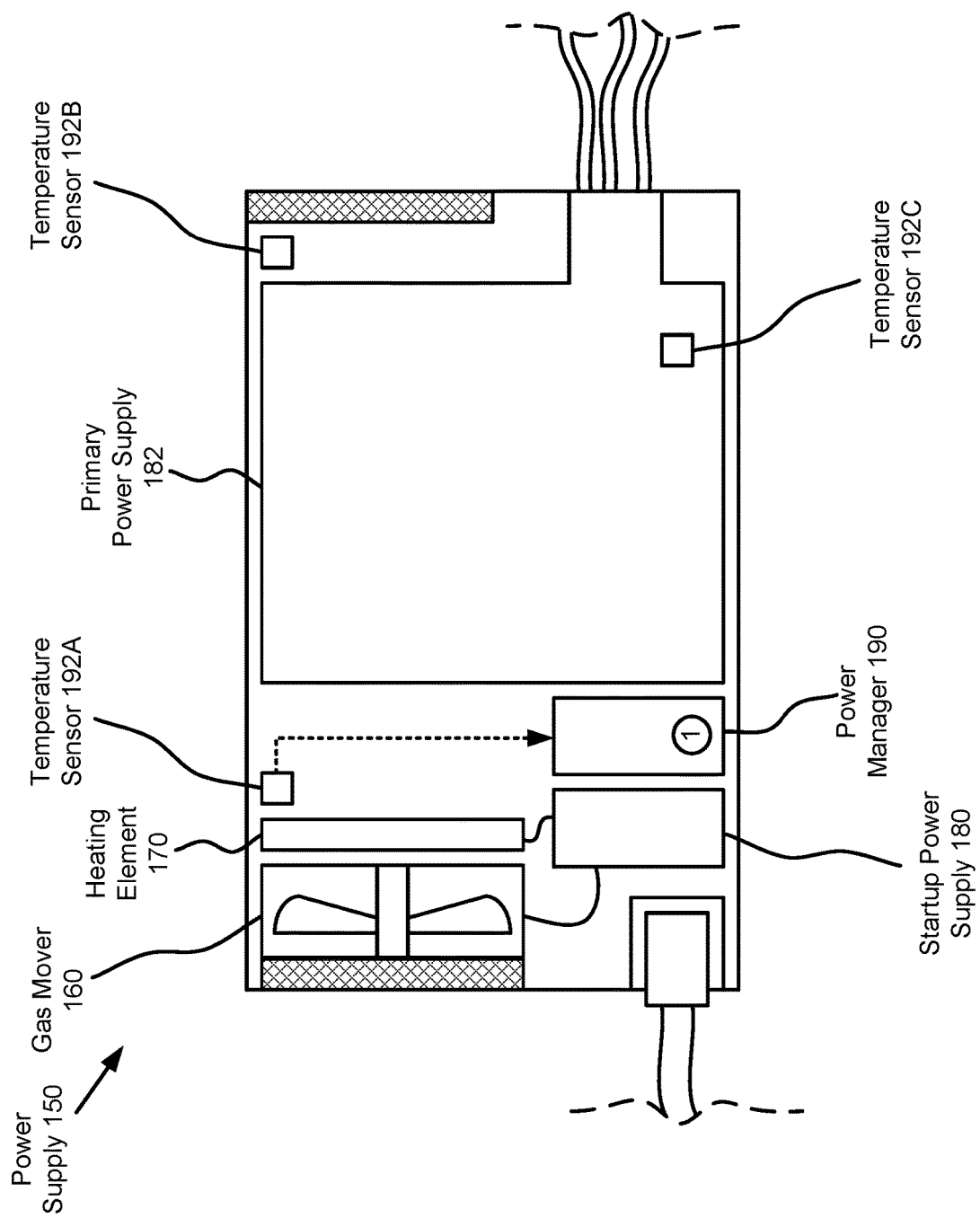

Turning to FIG. 4D, in response to being powered, at block 1, power manager 190 may read the temperature of gas mover 160 using temperature sensor 192A. From the reading, it determines that power supply 150 is not in condition to supply power to other components and that gas mover 160 is not in condition to operate.

Figure 4E:
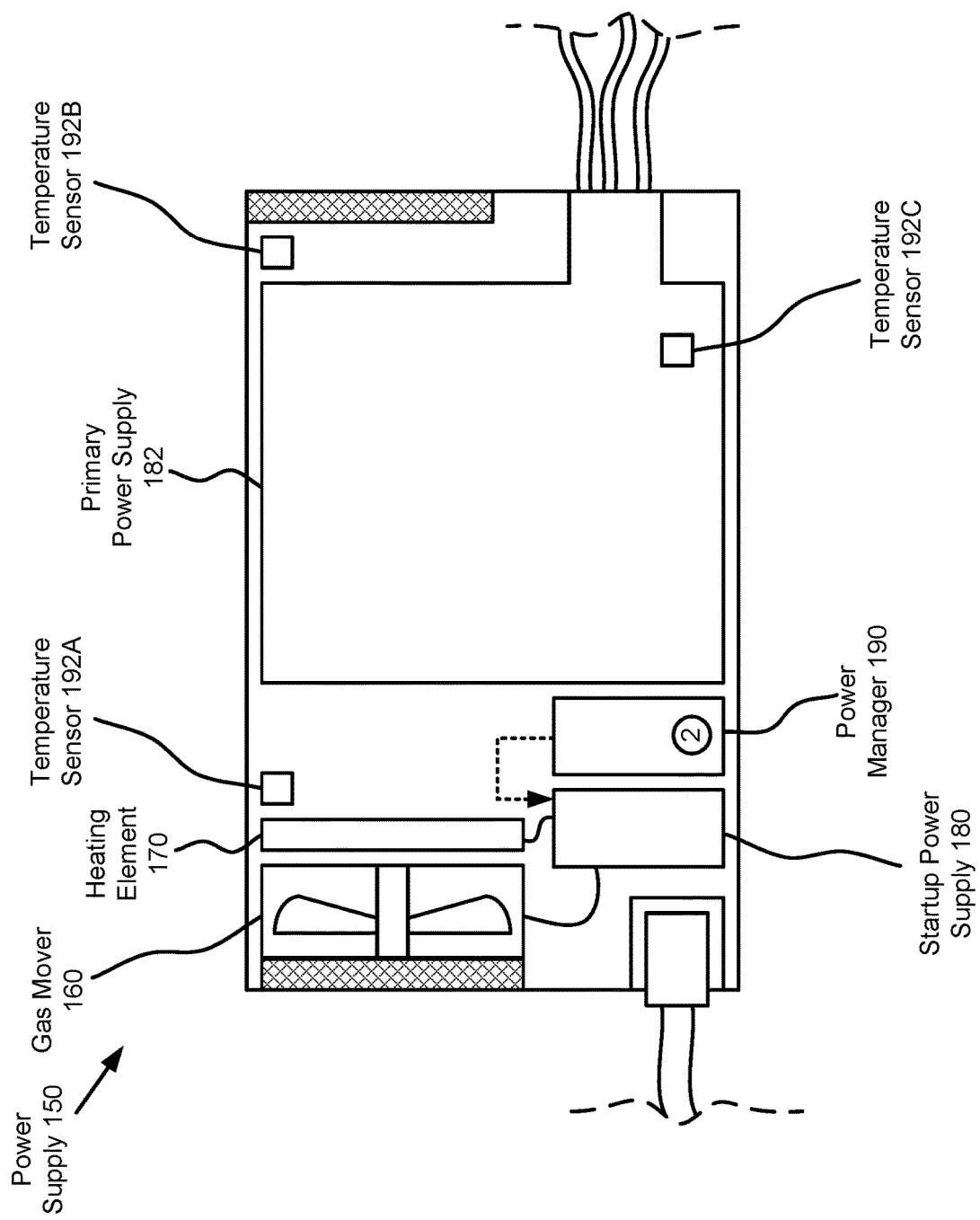
Figure 4F:
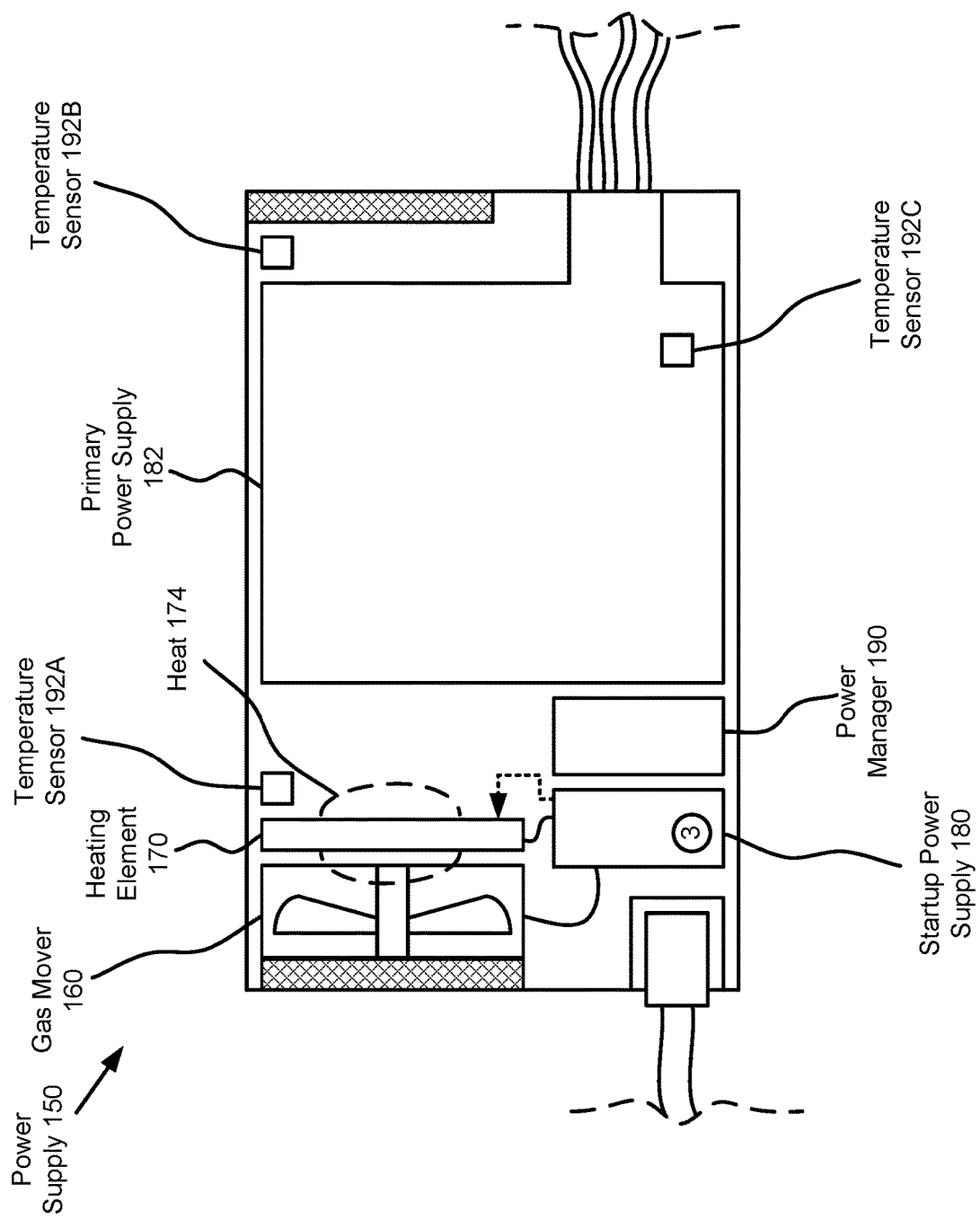

Turning to FIG. 4E, in response to this determination, at block 2, power manager 190 instructs startup power supply 180 to supply power to heating element 170. Turning to FIG. 4F, in response to the instructions, at block 3, startup power supply 180 begins to supply power to heating element 170 which results in the generation of heat 174 (shown with the long dashed lines on either side of heating element 170 in FIG. 4F). Heat 174 increases the temperature of gas mover 160 by virtue of the proximity of heating element 170 to gas mover 160, but only causes limited heating of other components such as primary power supply 182 (e.g., at insufficient levels to increase its temperature to be within its thermal operating range).

Figure 4G:
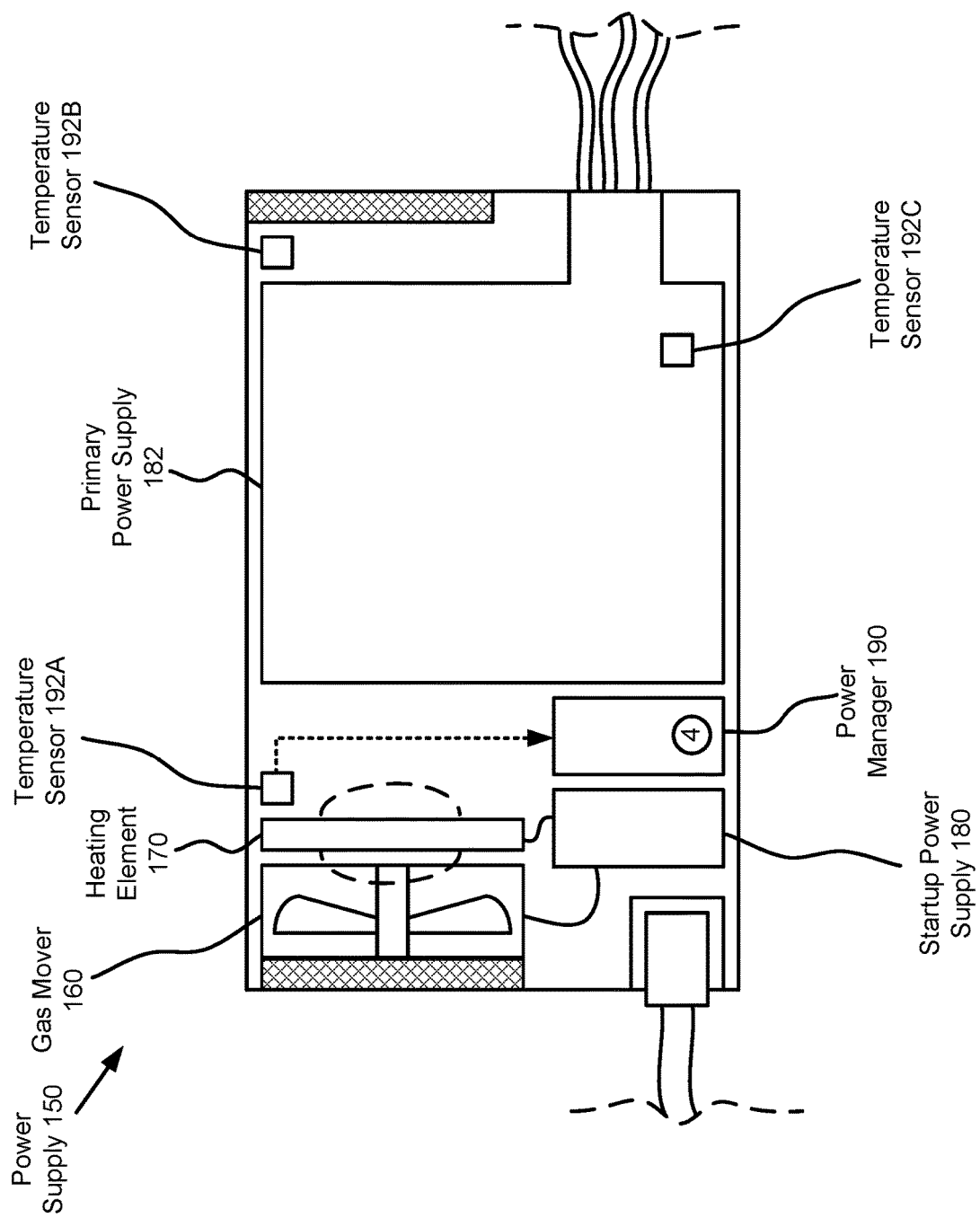

Turning to FIG. 4G, while gas mover 160 is heated, power manager 190, at block 4, monitors the thermal state of gas mover 160 using temperature sensor 192A until gas mover 160 is within its thermal operating range.

Figure 4H:
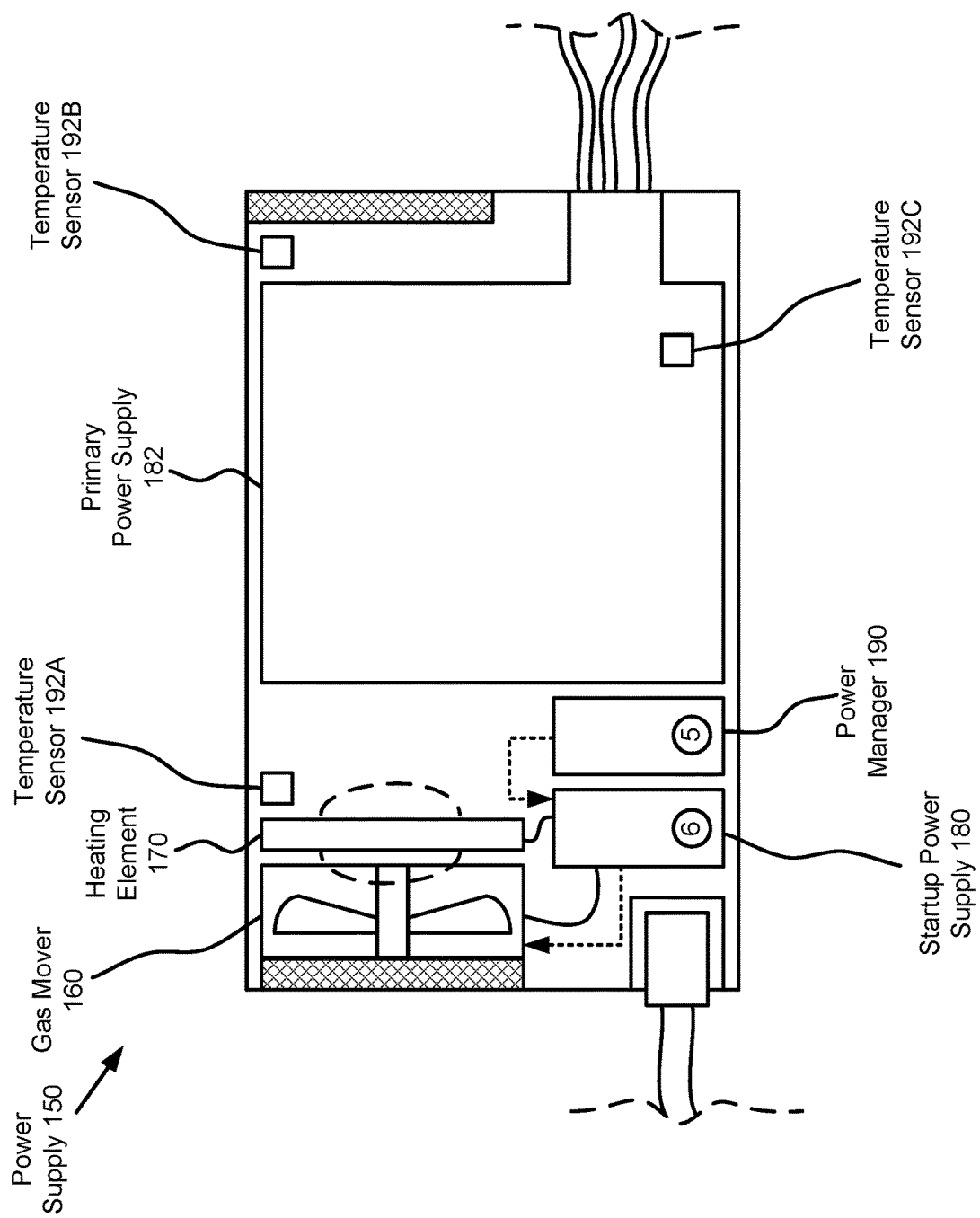

Turning to FIG. 4H, once gas mover 160 is within its thermal operating range, at block 5, power manager 190 instructs startup power supply 180 to provide power to gas mover 160. In response, at block 6, startup power supply 180 supplies power to gas mover 160 which initiates its operation.

Figure 4I:
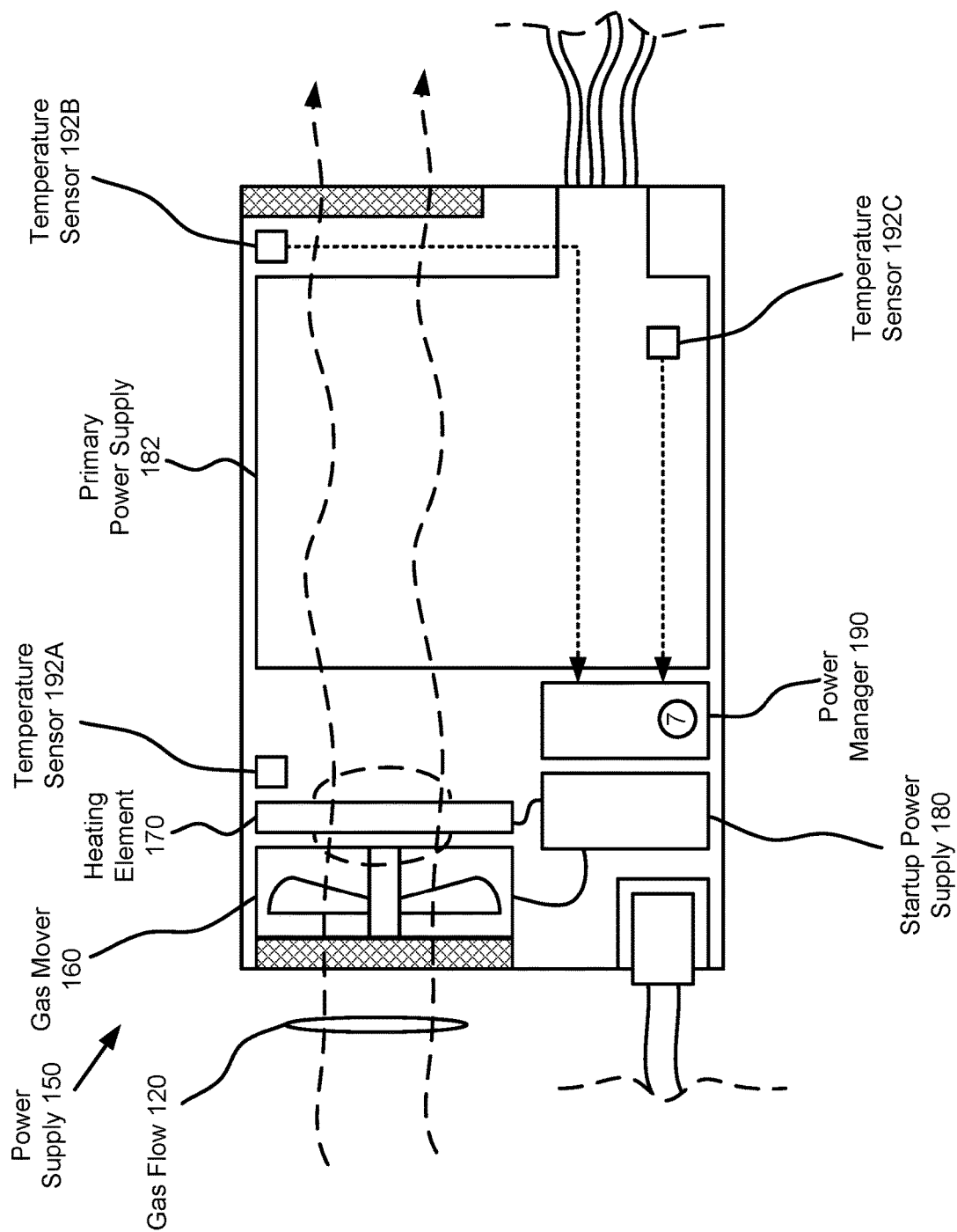
Figure 4J:
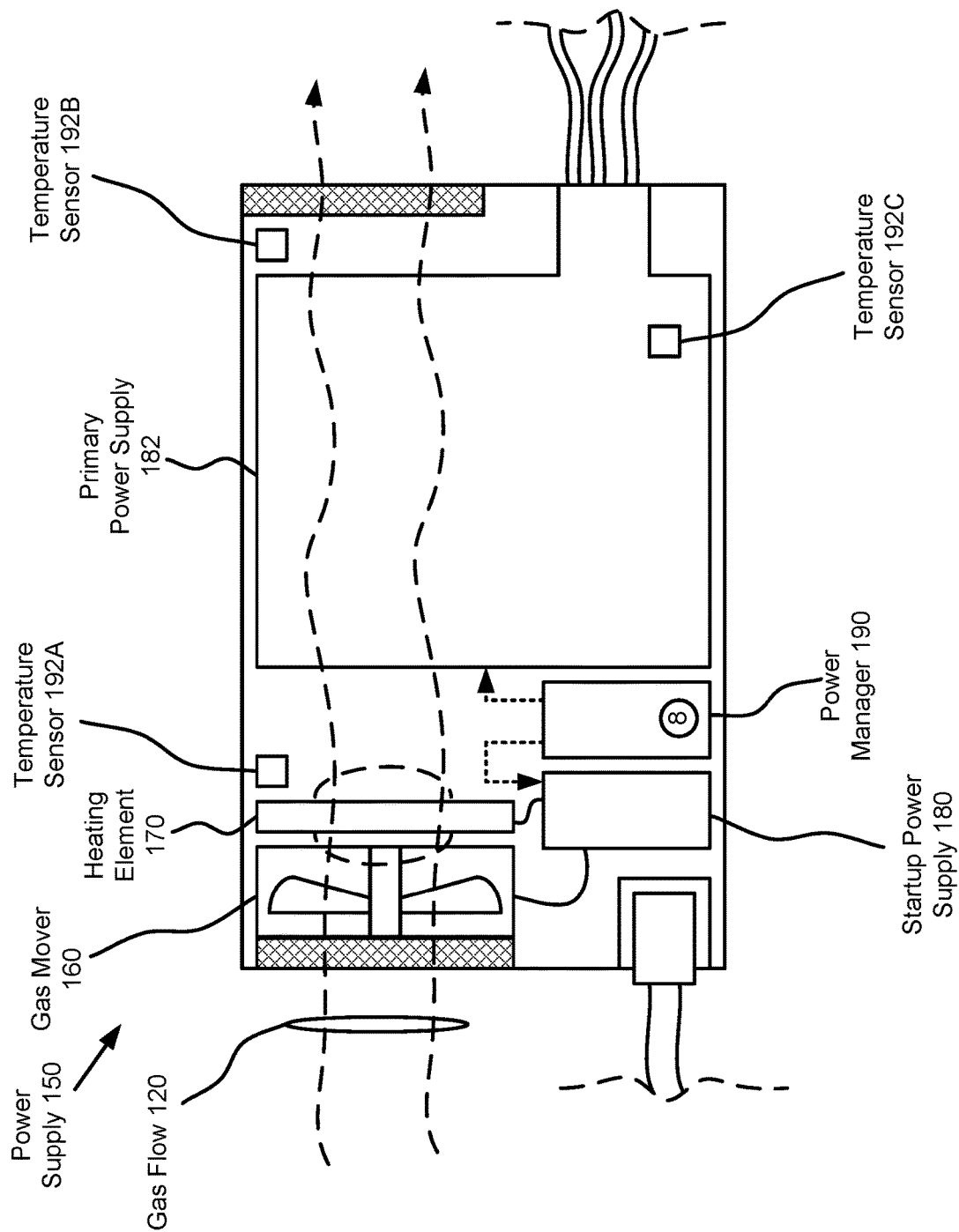

Turning to FIG. 4I, operation of gas mover 160 results in the generation of gas flow 120 which, as seen by the arrows having wavy dashed tails, passes proximately to both heating element 170 (thereby generating a heated gas flow) and primary power supply 182 (which causes the heated gas flow to heat primary power supply 182).

While primary power supply 182 is heated, at block 7, power manager 190 reads temperature sensors 192B, 192C to ascertain the thermal state of primary power supply 182 over time. Once the thermal state of primary power supply 182 is within its rated operating range, turning to FIG. 4J, at block 8, power manager 190 instructs startup power supply 180 to depower heating element 170 and primary power supply 182 to begin to provide power to power consuming entities.

Figure 4K:
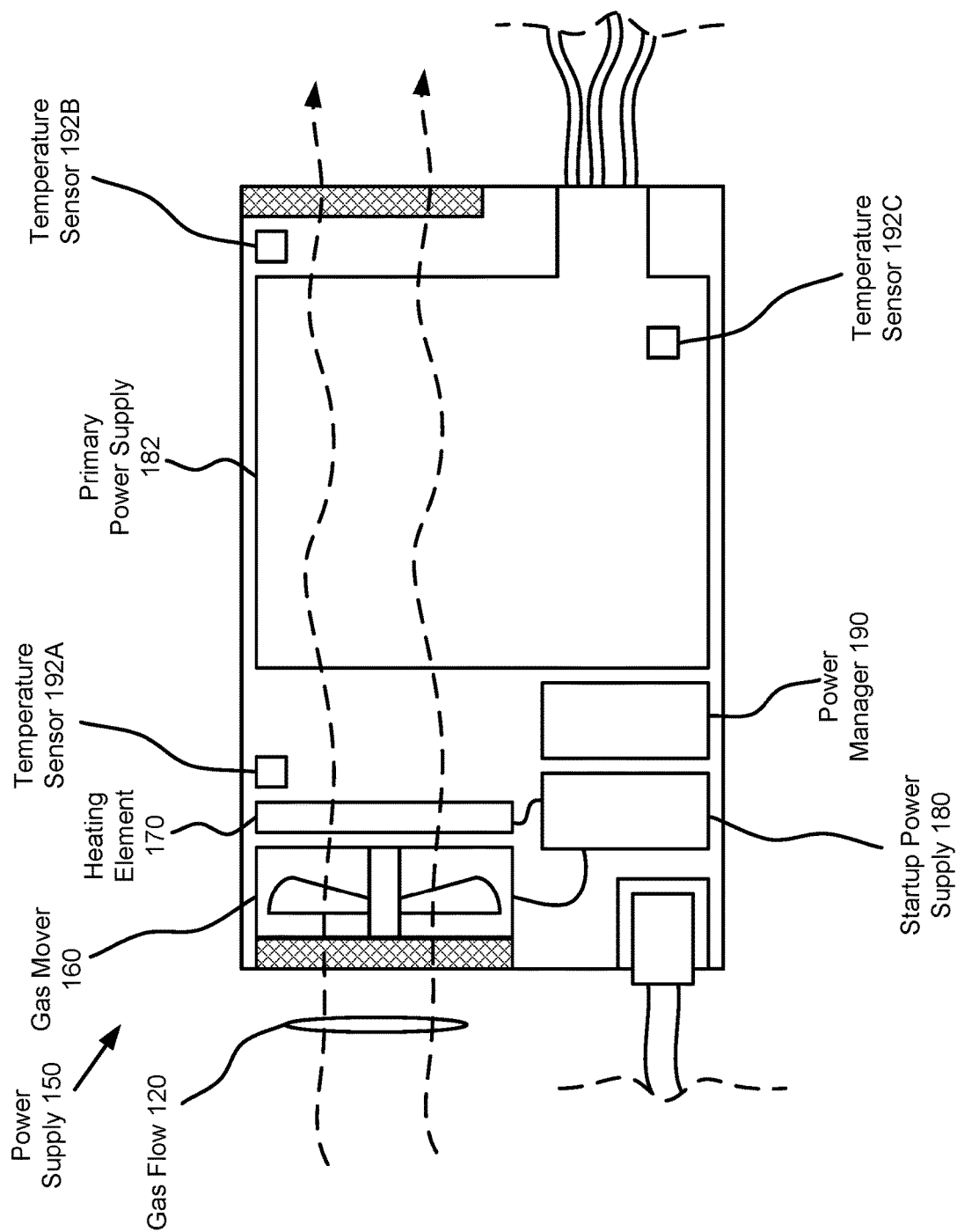

Turning to FIG. 4K, once startup power supply 180 stops supplying power to heating element 170, generation of heat is terminated (operation of primary power supply 182 may generate sufficient heat to maintain its and/or the temperature of components of power supply 150, and/or heating element 170 may be reactivated over time to maintain the temperatures of these components within their rated operating ranges).

Figure 5:
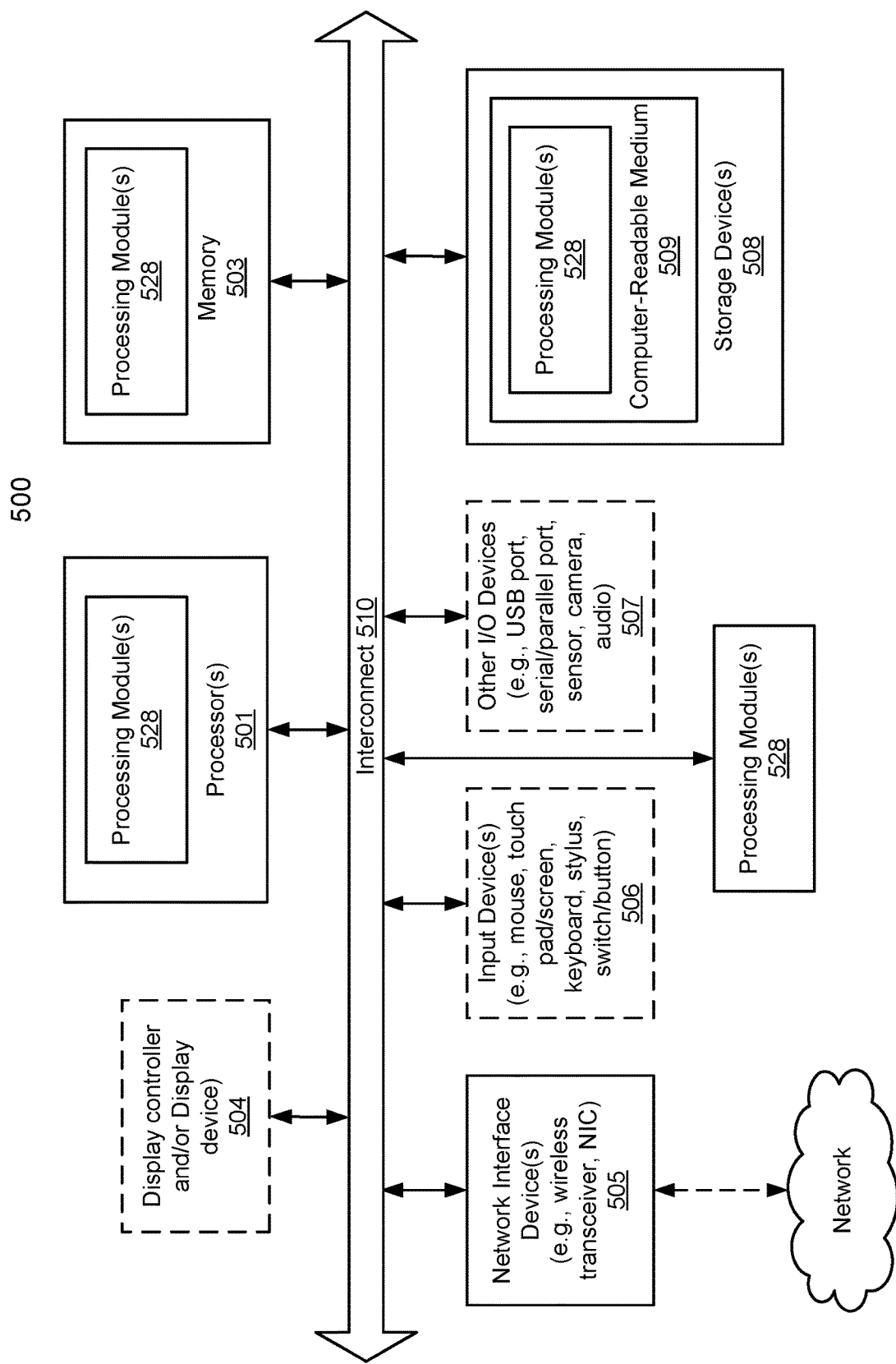
FIG. 5 shows a block diagram illustrating a data processing system in accordance with an embodiment.

Any of the components illustrated in FIGS. 1A-4K may be implemented with one or more computing devices. Turning to FIG. 5, a block diagram illustrating an example of a data processing system (e.g., a computing device) in accordance with an embodiment is shown. For example, system 500 may represent any of data processing systems described above performing any of the processes or methods described above. System 500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 500 is intended to show a high level view of many components of the computer system. However, it is to be understood that additional components may be present in certain implementations and furthermore, different arrangement of the components shown may occur in other implementations. System 500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 500 includes processor 501, memory 503, and devices 505-508 via a bus or an interconnect 510. Processor 501 may represent a single processor or multiple processors with a single processor core or multiple processor cores included therein. Processor 501 may represent one or more general-purpose processors such as a microprocessor, a central processing unit (CPU), or the like. More particularly, processor 501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 501, which may be a low power multi-core processor socket such as an ultra-low voltage processor, may act as a main processing unit and central hub for communication with the various components of the system. Such processor can be implemented as a system on chip (SoC). Processor 501 is configured to execute instructions for performing the operations discussed herein. System 500 may further include a graphics interface that communicates with optional graphics subsystem 504, which may include a display controller, a graphics processor, and/or a display device.

Processor 501 may communicate with memory 503, which in one embodiment can be implemented via multiple memory devices to provide for a given amount of system memory. Memory 503 may include one or more volatile storage (or memory) devices such as random access memory (RAM), dynamic RAM (DRAM), synchronous DRAM (SDRAM), static RAM (SRAM), or other types of storage devices. Memory 503 may store information including sequences of instructions that are executed by processor 501, or any other device. For example, executable code and/or data of a variety of operating systems, device drivers, firmware (e.g., input output basic system or BIOS), and/or applications can be loaded in memory 503 and executed by processor 501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 500 may further include IO devices such as devices (e.g., 505, 506, 507, 508) including network interface device(s) 505, optional input device(s) 506, and other optional IO device(s) 507. Network interface device(s) 505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 506 may include a mouse, a touch pad, a touch sensitive screen (which may be integrated with a display device of optional graphics subsystem 504), a pointer device such as a stylus, and/or a keyboard (e.g., physical keyboard or a virtual keyboard displayed as part of a touch sensitive screen). For example, input device(s) 506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 507 may include an audio device. An audio device may include a speaker and/or a microphone to facilitate voice-enabled functions, such as voice recognition, voice replication, digital recording, and/or telephony functions. Other IO devices 507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 510 via a sensor hub (not shown), while other devices such as a keyboard or thermal sensor may be controlled by an embedded controller (not shown), dependent upon the specific configuration or design of system 500.

To provide for persistent storage of information such as data, applications, one or more operating systems and so forth, a mass storage (not shown) may also couple to processor 501. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 501, e.g., via a serial peripheral interface (SPI). This flash device may provide for non-volatile storage of system software, including a basic input/output software (BIOS) as well as other firmware of the system.

Storage device 508 may include computer-readable storage medium 509 (also known as a machine-readable storage medium or a computer-readable medium) on which is stored one or more sets of instructions or software (e.g., processing module, unit, and/or processing module/unit/logic 528) embodying any one or more of the methodologies or functions described herein. Processing module/unit/logic 528 may represent any of the components described above. Processing module/unit/logic 528 may also reside, completely or at least partially, within memory 503 and/or within processor 501 during execution thereof by system 500, memory 503 and processor 501 also constituting machine-accessible storage media. Processing module/unit/logic 528 may further be transmitted or received over a network via network interface device(s) 505.

Computer-readable storage medium 509 may also be used to store some software functionalities described above persistently. While computer-readable storage medium 509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 528, components and other features described herein can be implemented as discrete hardware components or integrated in the functionality of hardware components such as ASICS, FPGAs, DSPs or similar devices. In addition, processing module/unit/logic 528 can be implemented as firmware or functional circuitry within hardware devices. Further, processing module/unit/logic 528 can be implemented in any combination hardware devices and software components.

Note that while system 500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments of the invention as described herein.

In the foregoing specification, embodiments have been described with reference to specific exemplary embodiments thereof. It will be evident that various modifications may be made thereto without departing from the broader spirit and scope of the invention as set forth in the following claims.

The specification and drawings are, accordingly, to be regarded in an illustrative sense rather than a restrictive sense.

What is claimed is:

1. A power supply for powering a data processing system comprising hardware resources to provide computer implemented services, the power supply comprising:
   a power socket connected to an external power source;
   a gas mover;
   a heating element;
   a primary power supply adapted to receive electrical power directly from the external power source through the power socket and provide conditioned power to the hardware resources while a temperature of the primary power supply exceeds a threshold temperature;
   a startup power supply adapted to receive the electrical power directly from the external power source through the power socket and selectively provide conditioned power to:
      the gas mover, and
      the heating element;
   a power manager adapted to:
      prevent the primary power supply from attempting to provide the conditioned power while the temperature of the primary power supply is below the threshold temperature, and
      while the temperature of the primary power supply is below the threshold temperature:
         increase, with the gas mover, the heating element, and the startup power supply, the temperature of the primary power supply to exceed the threshold temperature;
   an enclosure comprising two gas vents, wherein the gas mover, the heating element, and at least a portion of the primary power supply are positioned along a gas flow path between the two gas vents;
   a first temperature sensor positioned to measure the temperature of the primary power supply; and
   a second temperature sensor positioned to measure a second temperature of the gas mover,
   wherein the first temperature sensors and the second temperature sensor are adapted to provide the measurements of the temperature of the primary power supply and the second temperature of the gas mover to the power manager.

2. The power supply of claim 1, wherein increasing the temperature of the primary power supply to exceed the threshold temperature comprises:
   locally heating, with the heating element and the startup power supply, the gas mover until a second temperature of the gas mover exceeds a second threshold temperature;
   after the temperature of the gas mover exceeds the second threshold temperature, initiating, with the gas mover, the heating element, and the startup power supply, heating of the primary power supply.

3. The power supply of claim 2, wherein initiating the heating of the primary power supply comprises:
   generating, with the gas mover, a flow of a gas towards the primary power supply;
   heating, with the heating element, the flow of the gas to obtain a heated gas flow; and
   initiating heat exchange between the heated gas flow and the primary power supply.

4. The power supply of claim 3, wherein the power manager is further adapted to:
   in response to the second temperature of the gas mover transitioning from being below the second threshold temperature to above the second threshold temperature:
      powering, with the startup power supply, the gas mover from an unpowered to a powered state;
      while the gas mover is in the powered state, performing an operational status check by applying a predetermined power sequence to the gas mover and measuring a mechanical response of the gas mover to the predetermined power sequence;
      when the operational status check indicates that the gas mover is in nominal operating condition, initiating the flow of the gas towards the primary power supply with the gas mover; and
      when the operational status check indicates that the gas mover is not in the nominal operating condition, delaying the initiating of the flow of the gas towards the primary power supply with the gas mover.

5. The power supply of claim 2, wherein the second threshold temperature is lower than the threshold temperature, the primary power supply is not rated to operate at temperatures between the second threshold temperature and the threshold temperature, the startup power supply is rated to operate at the temperatures between the second threshold temperature and the threshold temperature; and the startup power supply is unable to power the hardware resources.

6. The power supply of claim 1, wherein the heating element is positioned to heat the gas mover over the primary power supply while the heating element is powered by the startup power supply.

7. The power supply of claim 1, wherein the first temperature sensor is positioned with an exhaust gas vent of the two gas vents, and the threshold temperature is greater than a minimum rated operating temperature of the primary power supply.

8. The power supply of claim 1,
   wherein the gas mover comprises:
      a fan blade; and
      an electric motor coupled to the fan blade, and
   wherein the heating element comprises:
      a heating wire positioned on an exhaust side of the gas mover,
      wherein an intake side of the gas mover is positioned to intake gases from outside of the power supply.

9. The power supply of claim 8, wherein the heating wire is distributed over the exhaust side of the gas mover to heat substantially all exhaust gas from the gas mover while the heating element and gas mover are operating.

10. The power supply of claim 1, wherein a power rating of the primary power supply is higher than a power rating of the startup power supply.

11. The power supply of claim 1, wherein the primary power supply is unable to operate below a freezing point of water while the startup power supply is able to operate below the freezing point of water.

12. A data processing system to provide computer implemented services, the data processing system comprising:
   hardware resources used to provide the computer implemented services;
   a power supply comprising:
      a power socket connected to an external power source
      a gas mover;
      a heating element;
      a primary power supply adapted to receive electrical power directly from the external power source through the power socket and provide conditioned power to the hardware resources while a temperature of the primary power supply exceeds a threshold temperature;
a startup power supply adapted to receive the electrical power directly from the external power source through the power socket and selectively provide conditioned power to:
the gas mover, and
the heating element;
a power manager adapted to:
prevent the primary power supply from attempting to provide the conditioned power while the temperature of the primary power supply is below the threshold temperature, and
while the temperature of the primary power supply is below the threshold temperature:
increase, with the gas mover, the heating element, and the startup power supply, the temperature of the primary power supply to exceed the threshold temperature;
an enclosure comprising two gas vents, wherein the gas mover, the heating element, and at least a portion of the primary power supply are positioned along a gas flow path between the two gas vents;
a first temperature sensor positioned to measure the temperature of the primary power supply; and
a second temperature sensor positioned to measure a second temperature of the gas mover, wherein the first temperature sensors and the second temperature sensor are adapted to provide the measurements of the temperature of the primary power supply and the second temperature of the gas mover to the power manager.

13. The data processing system of claim 12, wherein the first temperature sensor is positioned with an exhaust gas vent of the two gas vents, and the threshold temperature is greater than a minimum rated operating temperature of the primary power supply.

14. The data processing system of claim 12, wherein increasing the temperature of the primary power supply to exceed the threshold temperature comprises:
locally heating, with the heating element and the startup power supply, the gas mover until a second temperature of the gas mover exceeds a second threshold temperature;
after the temperature of the gas mover exceeds the second threshold temperature, initiating, with the gas mover, the heating element, and the startup power supply, heating of the primary power supply.

15. The data processing system of claim 14, wherein initiating the heating of the primary power supply comprises:
generating, with the gas mover, a flow of a gas towards the primary power supply;
heating, with the heating element, the flow of the gas to obtain a heated gas flow; and
initiating heat exchange between the heated gas flow and the primary power supply.

16. The data processing system of claim 15, wherein the power manager is further adapted to:
in response to the second temperature of the gas mover transitioning from being below the second threshold temperature to above the second threshold temperature:
powering, with the startup power supply, the gas mover from an unpowered to a powered state;
while the gas mover is in the powered state, performing an operational status check by applying a predetermined power sequence to the gas mover and measuring a mechanical response of the gas mover to the predetermined power sequence;
when the operational status check indicates that the gas mover is in nominal operating condition, initiating the flow of the gas towards the primary power supply with the gas mover; and
when the operational status check indicates that the gas mover is not in the nominal operating condition, delaying the initiating of the flow of the gas towards the primary power supply with the gas mover.

17. A method of operating hardware resources of a data processing system to provide computer implemented services, the method comprising:
identifying, by a power manager of a power supply of the data processing system, a power on event, wherein the power supply comprises a power socket connected to an external power source;
determining, by the power manager, a thermal environment of the power supply;
making a determination, by the power manager and based on the thermal environment, that the power supply is unable to complete a rapid start to power the hardware resources using electric power directly received from the external power source through the power socket because a temperature of a primary power supply of the power supply adapted to provide conditioned power to the hardware resources using the electrical power is below a threshold temperature;
based on the determination:
preventing, by the power manager, the primary power supply from attempting to provide the conditioned power while the temperature of the primary power supply is below the threshold temperature;
remediating, with a startup power supply of the power supply, a heating element of the power supply, and a gas mover of the power supply, the thermal environment to place the power supply in condition for the rapid start by increasing the temperature of the primary power supply to exceed the threshold temperature, the startup power supply using the electric power directly received from the external power source through the power socket to power the heating element and the gas mover; and
performing, by the power manager, the rapid start of the power supply by initiating operation of the primary power supply of the power supply to supply power to the hardware resources after the temperature of the primary power supply exceeds the threshold temperature,
wherein the power supply further comprises an enclosure comprising two gas vents, wherein the gas mover, the heating element, and at least a portion of the primary power supply are positioned along a gas flow path between the two gas vents, and
the method further comprises:
measuring the temperature of the primary power supply using a first temperature sensor of the power supply;
measuring a second temperature of the gas mover using a second temperature sensor of the power supply; and
providing, by the first temperature sensors and the second temperature sensor, the measurements of the temperature of the primary power supply and the second temperature of the gas mover to the power manager.

18. The method of claim 17, wherein remediating the thermal environment to place the power supply in condition for the rapid start comprises:
- identifying, based on the thermal environment, a first thermal state of the gas mover of the power supply and a second thermal state of the primary power supply;
- making a second determination that the first thermal state indicates that the gas mover is subject to undesirable operation;
- based on the second determination:
  - remediating the first thermal state of the gas mover using the heating element of the power supply and the startup power supply of the power supply to obtain a thermal state remediated gas mover; and
  - remediating the second thermal state of the primary power supply using the thermal state remediated gas mover, the heating element, and the startup power supply.

19. The method of claim 17, wherein the primary power supply is rated to operate above a first threshold temperature, the startup power supply is rated to operate above a second threshold temperature which is lower than the first threshold temperature, and the startup power supply is unable to power the hardware resources.

20. The method of claim 18, wherein remediating the first thermal state comprises:
- powering the heating element with the startup power supply,
- wherein the heating element is positioned to heat the gas mover over the primary power supply while the heating element is powered by the startup power supply.

* * * * *